United States Patent
Tsudaka

[11] Patent Number: 6,154,563
[45] Date of Patent: Nov. 28, 2000

[54] METHOD OF CORRECTING MASK PATTERN AND MASK, METHOD OF EXPOSURE, APPARATUS THEREOF, AND PHOTOMASK AND SEMICONDUCTOR DEVICE USING THE SAME

[75] Inventor: Keisuke Tsudaka, Kanagawa, Japan

[73] Assignee: Sony Corporation, Tokyo, Japan

[ * ] Notice: This patent is subject to a terminal disclaimer.

[21] Appl. No.: 09/213,755

[22] Filed: Dec. 17, 1998

Related U.S. Application Data

[62] Division of application No. 08/679,776, Jul. 15, 1996, Pat. No. 6,014,456.

[30] Foreign Application Priority Data

Jul. 17, 1995 [JP] Japan ............................. PO7-179953

[51] Int. Cl.[7] .................................................. G06K 9/00
[52] U.S. Cl. ........................ 382/144; 382/145; 382/151
[58] Field of Search .................................. 382/141–151; 430/5, 30, 22, 311, 394; 356/232, 369, 312; 355/52, 53, 55, 23

[56] References Cited

U.S. PATENT DOCUMENTS

| | | | |
|---|---|---|---|
| 5,008,702 | 4/1991 | Tanaka et al. | 355/52 |
| 5,442,418 | 8/1995 | Murakami et al. | 355/53 |
| 5,631,110 | 5/1997 | Shioiri et al. | 430/5 |
| 5,736,280 | 4/1998 | Tsudaka | 430/30 |
| 6,014,456 | 1/2000 | Tsudaka | 382/144 |

*Primary Examiner*—Jose L. Couso
*Assistant Examiner*—Duy M. Dang
*Attorney, Agent, or Firm*—Ronald P. Kananen; Rader, Fishman & Grauer

[57] ABSTRACT

A method of correcting a mask pattern wherein the mask pattern of a photomask used in a photolithography process is made to deform so as to give a transfer image close to a desired design pattern. The method including: an evaluation point arranging step for arranging a plurality of evaluation points along the outer periphery of the desired design pattern, a simulation step for simulating a transfer image obtained at exposure under predetermined transfer conditions using a photomask of a design pattern with evaluation points, a comparison step for comparing for each evaluation point the difference between the simulated transfer image and the design pattern, and a deformation step for deforming the design pattern in accordance with the differences compared for each evaluation point so that the differences become smaller. In the evaluation point arranging step, for example, the evaluation points are arranged at the corners of the desired design pattern and arranging the evaluation points at predetermined intervals at the sides of the pattern.

31 Claims, 40 Drawing Sheets

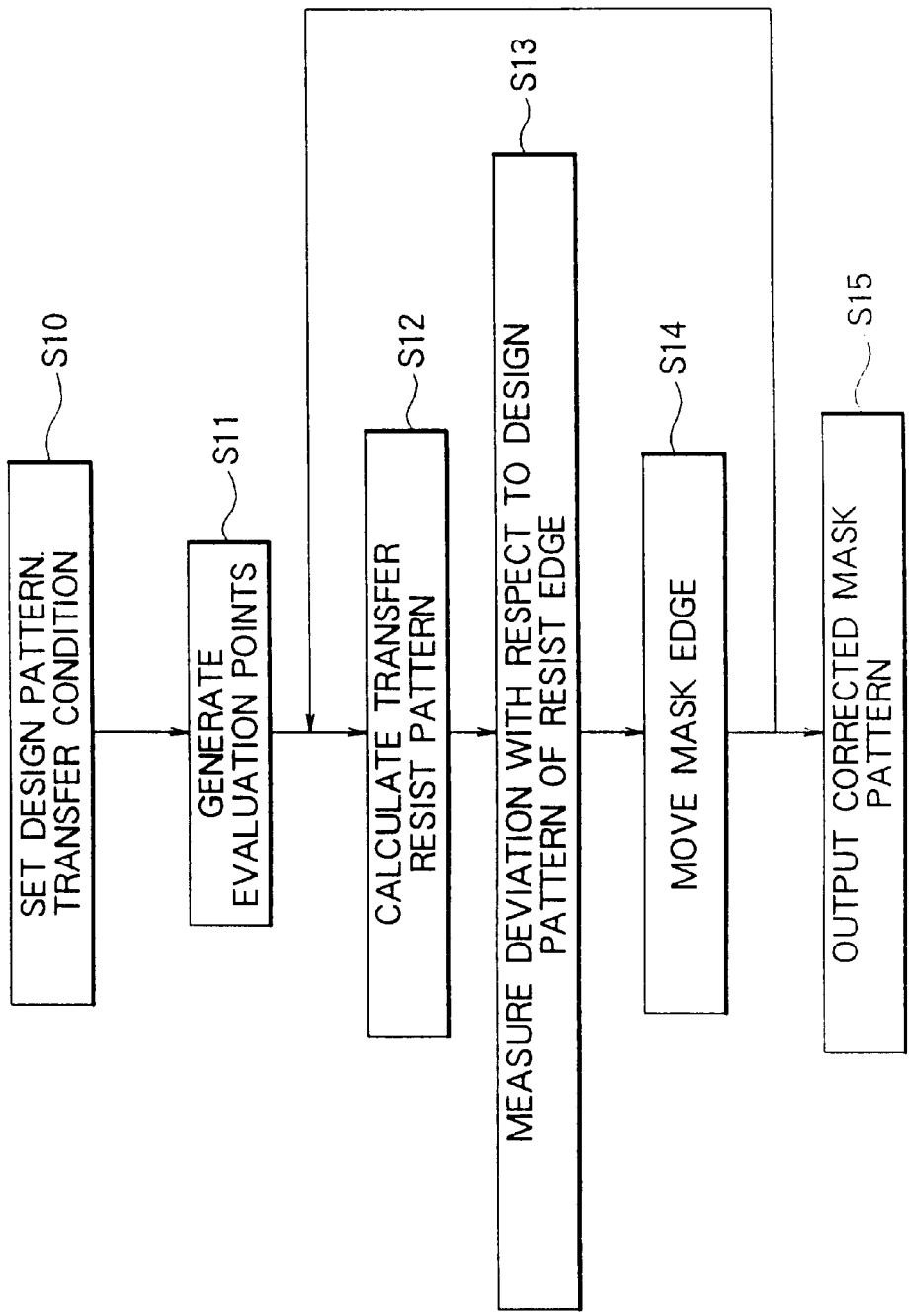

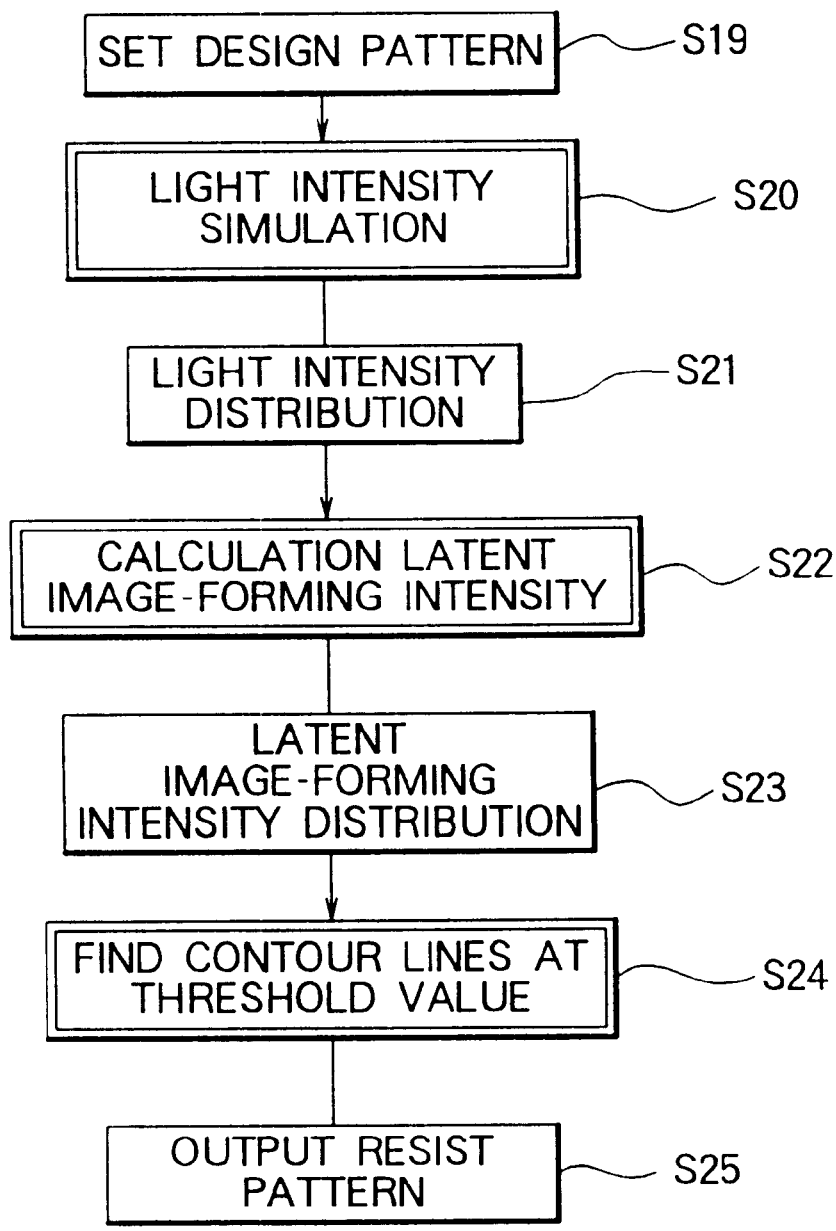

CORRECTING METHOD

MEASURE AMOUNT OF DEVIATION OF RESIST EDGE FOR EVERY EVALUATION POINT

MOVE MASK PATTERN EDGE EXACTLY BY AMOUNT OBTAINED BY MULTIPLYING AMOUNT OF DEVIATION OF EDGE BY COEFFICIENT (CAN BE SET)

$\alpha$ : 0.131   ETH : 197.01   $3\sigma$ : 0.0153

| DEFOCUS $\mu m$ | EXPOSURE TIME sec | SEM $\mu m$ | PRESENT PROCEDURE $\mu m$ | DIFFERENCE $\mu m$ |
|---|---|---|---|---|
| 0 | 475 | 0.482 | 0.472 | -0.01 |
| 0 | 500 | 0.458 | 0.449 | -0.009 |
| 0 | 525 | 0.437 | 0.429 | -0.008 |
| 0 | 550 | 0.412 | 0.412 | 0 |
| 0 | 575 | 0.394 | 0.395 | 0.001 |
| 0 | 600 | 0.38 | 0.38 | 0 |
| 0 | 625 | 0.336 | 0.366 | 0 |
| 0 | 650 | 0.357 | 0.353 | -0.004 |
| 0 | 675 | 0.347 | 0.34 | -0.006 |
| 0 | 700 | 0.333 | 0.329 | -0.004 |
| 0 | 725 | 0.322 | 0.319 | -0.003 |
| -1 | 555 | 0.408 | 0.414 | 0.006 |
| -0.8 | 555 | 0.404 | 0.411 | 0.007 |
| -0.6 | 555 | 0.404 | 0.41 | 0.006 |
| -0.4 | 555 | 0.403 | 0.409 | 0.006 |
| -0.2 | 555 | 0.402 | 0.408 | 0.006 |
| 0 | 555 | 0.405 | 0.408 | 0.003 |
| 0.2 | 555 | 0.41 | 0.408 | -0.002 |
| 0.4 | 555 | 0.407 | 0.409 | 0.002 |
| 0.6 | 555 | 0.406 | 0.41 | 0.004 |
| 0.8 | 555 | 0.413 | 0.411 | 0.002 |

$\alpha$ : 0.00    ETH : 193.54    $3\sigma$ : 0.0313

| DEFOCUS μm | EXPOSURE TIME sec | SEM μm | PRESENT PROCEDURE μm | DIFFERENCE μm |
|---|---|---|---|---|
| 0 | 475 | 0.482 | 0.454 | -0.023 |
| 0 | 500 | 0.458 | 0.437 | -0.021 |
| 0 | 525 | 0.437 | 0.422 | -0.015 |
| 0 | 550 | 0.412 | 0.409 | -0.003 |
| 0 | 575 | 0.394 | 0.397 | 0.003 |
| 0 | 600 | 0.38 | 0.385 | 0.005 |
| 0 | 625 | 0.336 | 0.375 | 0.009 |
| 0 | 650 | 0.357 | 0.365 | 0.008 |
| 0 | 675 | 0.347 | 0.356 | 0.009 |
| 0 | 700 | 0.333 | 0.347 | 0.014 |
| 0 | 725 | 0.322 | 0.339 | 0.017 |
| -1 | 555 | 0.408 | 0.411 | 0.003 |
| -0.8 | 555 | 0.404 | 0.409 | 0.005 |
| -0.6 | 555 | 0.404 | 0.408 | 0.004 |
| -0.4 | 555 | 0.403 | 0.407 | 0.004 |
| -0.2 | 555 | 0.402 | 0.407 | 0.005 |
| 0 | 555 | 0.405 | 0.406 | 0.001 |
| 0.2 | 555 | 0.41 | 0.407 | -0.003 |
| 0.4 | 555 | 0.407 | 0.407 | 0 |
| 0.6 | 555 | 0.406 | 0.408 | 0.002 |
| 0.8 | 555 | 0.413 | 0.409 | -0.004 |

METHOD OF CORRECTING MASK PATTERN AND MASK, METHOD OF EXPOSURE, APPARATUS THEREOF, AND PHOTOMASK AND SEMICONDUCTOR DEVICE USING THE SAME

This application is a divisional of application Ser. No. 08/679,776 filed Jul. 15, 1996 now U.S. Pat. No. 6,014,456.

BACKGROUND OF THE INVENTION

1. Field of the Invention

The present invention relates to a method of correcting a mask pattern which causes a mask pattern of a photomask used when producing a semiconductor device etc. to deform so as to give a transfer image close to a desired design pattern, a correction apparatus working this method of correction, a photomask obtained by this method of correction, an exposure method for performing exposure using a photomask having such a corrected mask pattern, a semiconductor device produced by photolithography using a photomask having such a corrected mask pattern, and an apparatus for production of a photomask and an apparatus for production of a semiconductor device using this method of correction.

2. Description of the Related Art

In the production of a semiconductor device etc., the process for transferring a mask pattern to a resist material on a semiconductor wafer is referred to as the photolithographic process.

In recent years, along with the increasing miniaturization of the semiconductor devices produced, the design rule has become smaller and lithography is being performed near the theoretical limit of resolution. This fact is leading to the disadvantages of a deterioration of the performance of the semiconductor device due to deformation of the transfer pattern and reduction of yield due to bridging (error connection) and disconnection of the patterns. Accordingly, the mask patterns have been optimized by trial and error so as to obtain the desired resist pattern. The practice has been to prepare mask patterns to which have been added a plurality of modification patterns for a design pattern, find the transfer patterns by simulation in transfer experiments, and add the modification pattern giving the transfer pattern closest to the design pattern to the mask pattern.

In recent years, light proximity effect correction techniques by which mask patterns have been automatically optimized by computer, have been developed. In the light proximity effect correction, the mask pattern deformed so as to improve the transfer image to match with the input design pattern has been sought by computations.

However, it suffers from the following disadvantages in the related art. In the trial and error method, it takes tremendous time and work to find the optimal mask pattern. Therefore, this can only be used for limited patterns. Accordingly, it cannot be used for irregular patterns such as ASICs(Applied Specific Integrated Circuits). Further, in the trial and error method, the number of mask patterns which can be evaluated is limited. Therefore, there is the possibility of overlooking a better mask pattern and the precision of correction of the mask pattern is limited.

Therefore, in recent years, technologies for automatically correcting mask patterns have been developed. These have had the following disadvantages, however.

First, the corrected mask pattern would sometimes cause a deterioration in the processing margin, that is, the exposure margin and the focal depth. Therefore, the correction might conversely cause a deterioration in the yield, making use for actual processes impossible.

Further, one method of correction is to find the distribution of light intensity using simulation of the light intensity, use the contour lines obtained by slicing by the threshold value of the same as the transfer image, and correct this to the optimal mask pattern. In this method, however, no consideration is given to the resist process, so the contour lines obtained by slicing the distribution of light intensity do not match the resist image obtained by the actual process and thus the resist image is not sufficiently corrected.

Further, depending on the method of correction, due to the excessive correction of the corners of the pattern or the ends of the line patterns etc., distortion would occur at other portions, bridging (miss-connection) of the resist pattern would occur when the amount of exposure or focal position fluctuated, or mask patterns difficult to fabricate would be produced.

SUMMARY OF THE INVENTION

An object of the present invention is to provide a means and method for enabling calculation of a mask pattern so as to give a resist pattern close to the design pattern and thereby produce a high performance device with a high yield.

According to one aspect of the present invention, there is provided a method of correcting a mask pattern wherein in the mask pattern of a photomask used in a photolithography step is made to deform so as to give a transfer image close to a desired design pattern, the method of correcting a mask pattern comprises: an evaluation point arranging step for arranging a plurality of evaluation points along the outer periphery of the desired design pattern; a simulation step for simulating a transfer image obtained at exposure under predetermined transfer conditions using a photomask of a design pattern with evaluation points; a comparison step for comparing for each evaluation point the difference between the simulated transfer image and the design pattern; and a deformation step for deforming the design pattern in accordance with the differences compared for each evaluation point so that the differences become smaller.

The evaluation point arranging step arranges the evaluation points at the corners of the desired design pattern and arranges the evaluation points at predetermined intervals at the sides of the pattern.

Or, the evaluation point arranging steps arranges the evaluation points at the corners of the desired design pattern, adds a predetermined number of evaluation points at predetermined narrow intervals from the corners at the sides of the pattern, and arranges the evaluation points at predetermined wide intervals at remaining portions of the sides away from the corners.

Or, the evaluation point arranging step does not add evaluation points at the small sides of the design pattern of less than predetermined lengths, does not add evaluation points at the corners near the small sides, and arranges the evaluation points at predetermined intervals at the other corners and sides.

Or, the evaluation point arranging step arranges the evaluation points at the corners of the design pattern not at the boundaries of predetermined repeating regions and arranging the evaluation points at predetermined intervals at the sides of the pattern not at the boundaries of predetermined repeating regions.

Or, the evaluation point arranging step arranges the evaluation points at the corners of the design pattern not at the boundaries of predetermined repeating regions and arranging the evaluation points at predetermined intervals at the sides of the pattern not at the boundaries of predetermined repeating regions.

Or, the evaluation point arranging step arranges the evaluation points at the corners of the design pattern, adds evaluation points at the substantially midpoints of short sides of the pattern smaller than a predetermined width, and arranges the evaluation points at predetermined intervals at the other sides of the pattern.

Or, the evaluation point arranging step arranges the evaluation points at the corners of the design pattern except corners of the pattern adjoining sides shorter than a predetermined length, adds evaluation points at relatively large intervals at the ends adjoining the sides shorter than a predetermined length at sides of the pattern longer than a predetermined length and arranges evaluation points at predetermined intervals at the sides of the pattern longer than the predetermined length.

Preferably, a design pattern deformed in the deformation step is used to repeat at least once the process from the simulation step to deformation step.

Preferably, the simulation step simulates transfer images under a plurality of transfer conditions based on combinations of a plurality of amounts of exposure of preset exposure margins and a plurality of focal positions within a preset range of focal depths to obtain a plurality of transfer images, the comparison step compares for each evaluation point the difference with the design pattern for each of the plurality of transfer patterns to calculate a plurality of differences for each evaluation point, and the deformation step deforms the design pattern so that the plurality of differences for each evaluation point become smaller by a predetermined criteria.

Preferably, the simulation step calculates a two-dimensional light intensity on a substrate based on the design pattern and exposure conditions, calculates and cumulatively adds the effects on the exposure energy of any noted position on the two-dimensional plane of the substrate by the light intensity at a plurality of positions surrounding that any noted position based on the light intensity at the surrounding positions and the distance between the noted position and surrounding positions so as to calculate the latent image-forming intensity at that any noted position, finds the distribution of the latent image-forming intensity at the two-dimensional plane of the substrate, determines the threshold value of the latent image-forming intensity corresponding to the amount of exposure and development conditions, finds the contour lines of the threshold value for the distribution of latent image-forming intensity, and calculates the pattern defined by the contour lines as the transfer image.

Preferably, the deformation step moves the boundary lines of the mask pattern near the evaluation points by exactly the magnitude of the magnitude of the difference compared for each evaluation point multiplied by a certain coefficient in a reverse direction to the difference.

Preferably, the coefficient is larger than 0 and less than 1.

Preferably, the evaluation point arranging step arranges a plurality of evaluation points along the outer periphery of the desired design pattern and sets target points separate from the evaluation points at predetermined evaluation points, the comparison step compares for each evaluation point the difference between the simulated transfer image and the design pattern at positions where just the evaluation points are set and compares the difference between the target points and transfer image at positions where the target points are set, and the deformation step deforms the design pattern in accordance with the difference compared for each evaluation point or for each target point so that the difference becomes smaller.

Preferably, the target points are set corresponding to the evaluation points positioned at the projecting corners or recessed corners of the design pattern, the target points being determined at the inside of the corners at the projecting corners and the target points being determined at the outside of the corners at the recessed corners.

According to another aspect of the invention, there is provided a photomask having a mask pattern corrected using the method of correction of a mask pattern as set forth above.

According to another aspect of the invention, there is provided a method of exposure for performing exposure using a photomask having a mask pattern corrected using the method of correction of a mask pattern as set forth above.

According to another aspect of the invention, there is provided a semiconductor device produced by photolithography using a photomask having a mask pattern corrected using the method of correction of a mask pattern as set forth above.

According to another aspect of the invention, there is provided an apparatus for correction of a mask pattern wherein the mask pattern of a photomask used in a photolithography step is made to deform so as to give a transfer image close to a desired design pattern, the apparatus for correction of a mask pattern comprising an evaluation point arranging means for arranging a plurality of evaluation points along the outer periphery of the desired design pattern, a simulating means for simulating a transfer image obtained at exposure under predetermined transfer conditions using a photomask of a design pattern with evaluation points, a comparing means for comparing for each evaluation point the difference between the simulated transfer image and the design pattern, and a deforming means for deforming the design pattern in accordance with the differences compared for each evaluation point so that the differences become smaller, the evaluation point arranging means arranging the evaluation points at the corners of the desired design pattern and arranging the evaluation points at predetermined intervals at the sides of the pattern; arranging the evaluation points at the corners of the desired design pattern, adding a predetermined number of evaluation points at predetermined narrow intervals from the corners at the sides of the pattern, and arranging the evaluation points at predetermined wide intervals at remaining portions of the sides away from the corners; not adding evaluation points at the small sides of the design pattern of less than predetermined lengths, not adding evaluation points at the corners near the small sides, and arranging the evaluation points at predetermined intervals at the other corners and sides; arranging the evaluation points at the corners of the design pattern not at the boundaries of predetermined repeating regions and arranging the evaluation points at predetermined intervals at the sides of the pattern not at the boundaries of predetermined repeating regions; arranging the evaluation points at the corners of the design pattern, adding evaluation points at the substantially midpoints of short sides of the pattern smaller than a predetermined width, and arranging the evaluation points at predetermined intervals at the other sides of the pattern; or arranging the evaluation points at the corners of the design pattern except corners of the pattern adjoining sides shorter than a predetermined length, adding evaluation points at relatively large intervals at the ends adjoining the sides shorter than a predetermined length at sides of the pattern longer than a predetermined length and arranging evaluation points at predetermined intervals at the sides of the pattern longer than the predetermined length.

Preferably, a design pattern deformed by the deforming means is used to repeat at least once the process from the simulation step to deformation step.

Preferably, the simulating means has a means for simulating transfer images under a plurality of transfer conditions based on combinations of a plurality of amounts of exposure of preset exposure margins and a plurality of focal positions within a preset range of focal depths to obtain a plurality of transfer images, the comparing means has a means for comparing for each evaluation point the difference with the design pattern for each of the plurality of transfer patterns to calculate a plurality of differences for each evaluation point, and the deforming means has a means for deforming the design pattern so that the plurality of differences for each evaluation point become smaller by a predetermined criteria.

Preferably, the simulating means has a means for calculating a two-dimensional light intensity on a substrate based on the design pattern and exposure conditions, a means for calculating and cumulatively adding the effects on the exposure energy of any noted position on the two-dimensional plane of the substrate by the light intensity at a plurality of positions surrounding that any noted position based on the light intensity at the surrounding positions and the distance between the noted position and surrounding positions so as to calculate the latent image-forming intensity at that any noted position, a means for finding the distribution of the latent image-forming intensity at the two-dimensional plane of the substrate, a means for determining the threshold value of the latent image-forming intensity corresponding to the amount of exposure and development conditions, a means for finding the contour lines of the threshold value for the distribution of latent image-forming intensity, and a means for calculating the pattern defined by the contour lines as the transfer image.

Preferably, the deforming means moves the boundary lines of the mask pattern near the evaluation points by exactly the magnitude of the magnitude of the difference compared for each evaluation point multiplied by a certain coefficient in a reverse direction to the difference.

Preferably, the coefficient is larger than 0 and less than 1.

According to another aspect of the invention, there is provided an apparatus for production of a photomask having an apparatus for correction of a mask pattern as set forth above and a drawing means for drawing a photomask of a mask pattern corrected by the apparatus for correction of a mask pattern.

According to another aspect of the invention, there is provided an apparatus for production of a semiconductor device having an apparatus for correction of a mask pattern as set forth above and an exposing means for performing exposure using a photomask of a mask pattern corrected by the apparatus for correction of a mask pattern.

BRIEF DESCRIPTION OF THE DRAWINGS

These and other objects and features of the invention will become more apparent from the following description of the preferred embodiments made with reference to the attached drawings, in which:

FIG. 2 is a flow chart of the procedure for correction of a mask pattern using the apparatus for correction shown in FIG. 1;

FIG. 3 is a flow chart of the procedure for calculation (simulation) of a transfer resist pattern;

DESCRIPTION OF THE PREFERRED EMBODIMENTS

Below, an explanation will be made of embodiments of the present invention.

EXAMPLE 1

Figure 1:
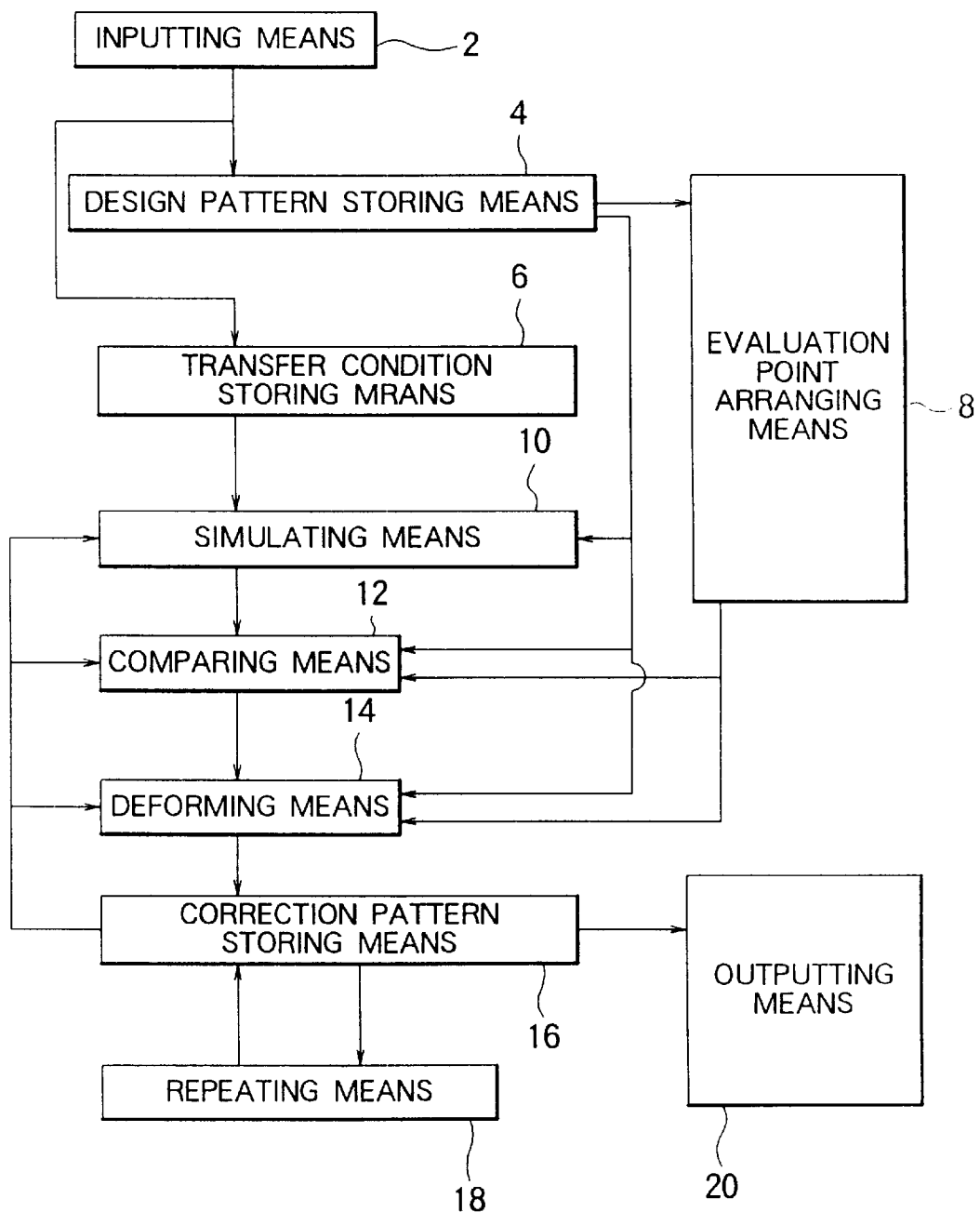
FIG. 1 is a schematic block diagram of an apparatus for correction of a mask pattern according to an embodiment of the present invention.

A schematic block diagram of an apparatus for correction of a mask pattern according to the present example is given in FIG. 1, and a schematic flow chart of the method of correction thereof is shown in FIG. 2.

As shown in FIG. 1, the apparatus for correction of a mask pattern according to the present example has an inputting means 2, a design pattern storing means 4, a transfer condition storing means 6, an evaluation point arranging means 8, a simulating means 10, a comparing means 12, a deforming means 14, a correction pattern storing means 16, a repeating means 18, and an outputting means 20.

The inputting means 2 is not particularly limited so far as it can input the design pattern, the transfer conditions, etc. A keyboard, a touch panel, etc. can be mentioned. Where the design pattern, transfer conditions, etc. are input in the form of electric signals, the inputting means 2 can be a wired or wireless input terminal as well. Further, where design pattern, transfer conditions etc. stored in a recording medium such as a floppy disk are input, the inputting means 2 is constituted by a disk drive or the like.

Further, as the outputting means 20, a cathode ray tube (CRT), a liquid crystal display device, or the like which can display at least a corrected design pattern on a screen can be used. Further, as the outputting means 20, it is also possible to adopt an outputting means such as a printer or an XY plotter which can draw at least the corrected design pattern on paper, film, or other substrates.

The other means 4, 6, 10, 12, 14, 16, and 18 shown in FIG. 1 are constituted by program information which is stored in a recording means such as an operating circuit, a random access memory (RAM), a read only memory (ROM), an optical recording medium, or the like, and processed by a central processing unit (CPU) of a computer.

The mode of operation of the device shown in FIG. 1 will be explained based on the flow chart shown in FIG. 2.

Figure 11:
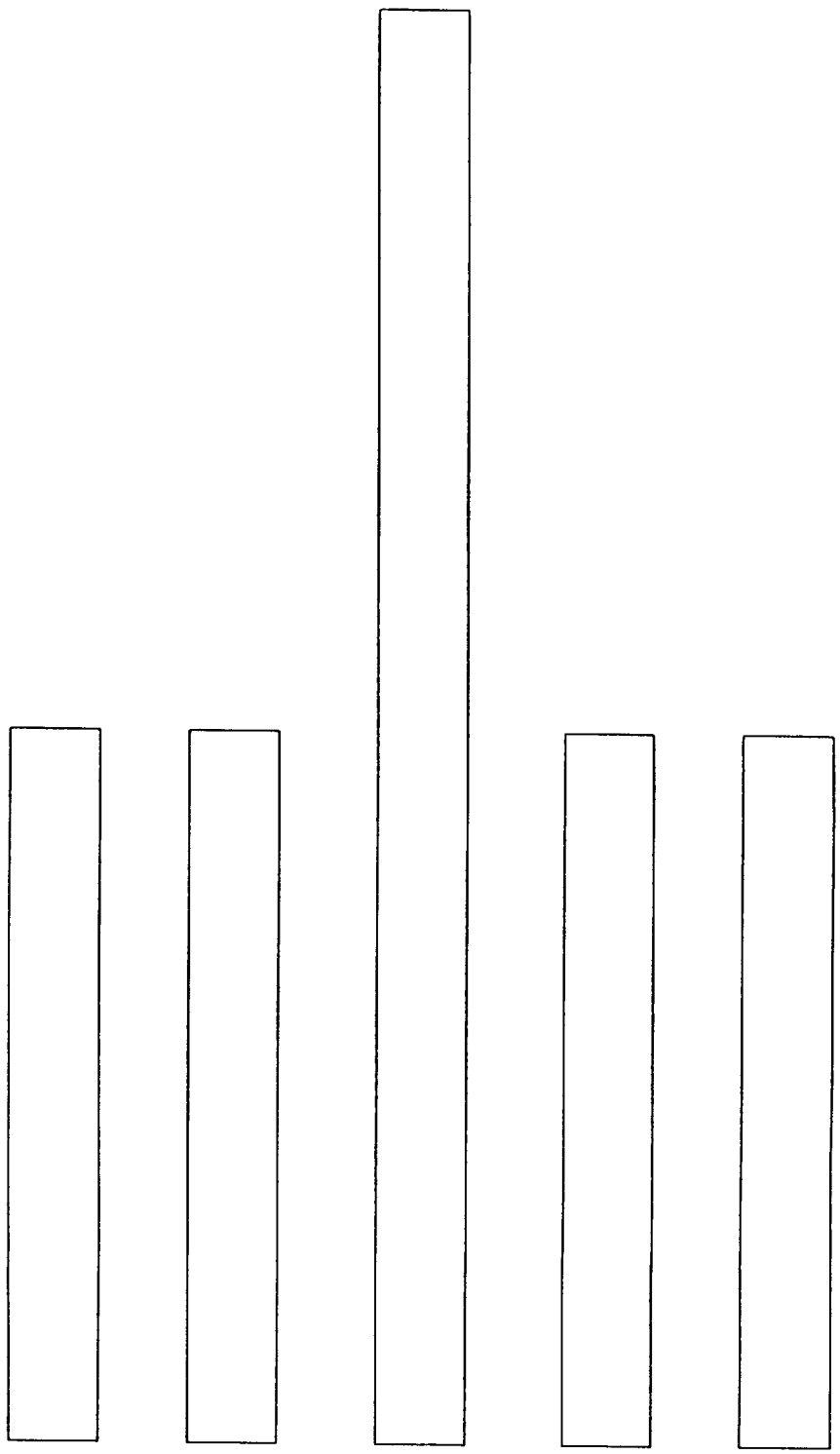
FIG. 11 is a plan view of an initial design pattern.

At step S10 shown in FIG. 2, the design pattern and the transfer conditions are stored in the design pattern storing means 4 and the transfer condition storing means 6 of the apparatus for correction shown in FIG. 1 from the inputting means 2 shown in FIG. 1, respectively. One example of the design pattern is shown in FIG. 11.

The transfer conditions are conditions concerning for example a wavelength $\lambda$ of the light used for the exposure, the numerical aperture NA, the apparent size $\sigma$ (partial coherence) of the light source or a distribution of the transmission rate of the light source, distribution of a phase and transmission rate of an exit pupil, and defocused condition.

Figure 35:
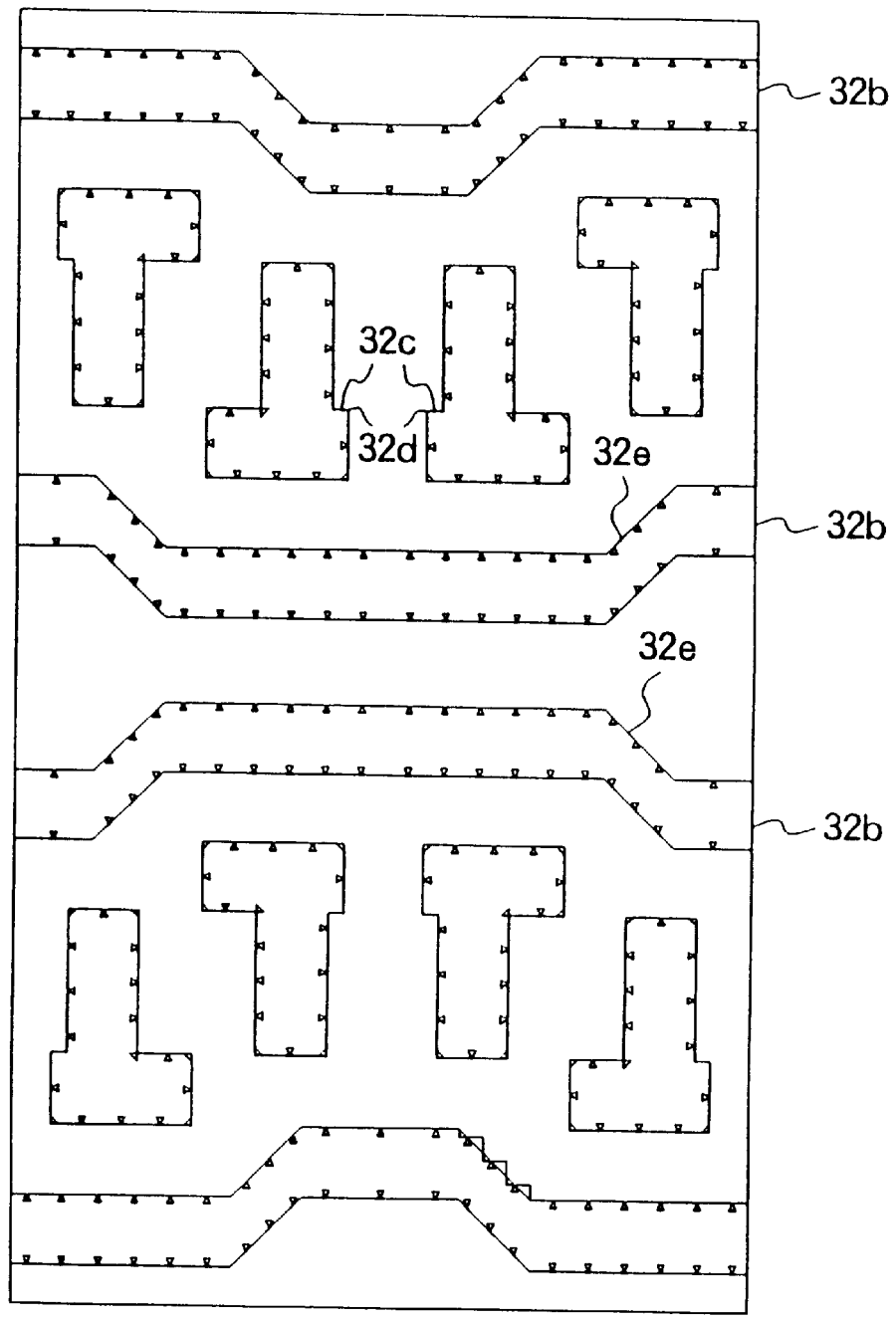
FIG. 35 is a plan view of an example of the method of arranging the evaluation points according to another embodiment.

At step S11 shown in FIG. 2, a plurality of evaluation points are prepared along an outer periphery of the design pattern. The preparation of the evaluation points is carried out by the evaluation point arranging means 8 based on the design pattern stored in the design pattern storing means 4 shown in FIG. 1. For example, as shown in FIG. 35, the evaluation points 30 are imparted based on the following rules along the outer periphery of the design pattern 32.

rul 1: Evaluation points are added to the corners of the design pattern.

rul 2: A predetermined number of evaluation points are added at the sides at predetermined small intervals starting from the corners and then further evaluation points are added at the sides at predetermined large intervals.

rul 3: Evaluation points are not added at corners next to very small sides, and evaluation points are not added to the very small sides.

rul 4: Sides next to repeating regions are not recognized as sides.

rul 5: Evaluation points are added to the midpoint of relatively small sides in sides to which the evaluation points are to be added.

rul 6: Evaluation points are added at relatively large intervals at sides of corners next to very small sides where no evaluation points are added.

In the above rules, the intervals of the evaluation points, the lengths of the very small sides, etc. can be freely set according to the design rule of the pattern, exposure conditions, pattern shape, etc.

At step S12 shown in FIG. 2, a transfer resist pattern (transfer image) is calculated by the simulating means 10 shown in FIG. 1. As the simulating means 10, use can be made of for example a commercially available light intensity simulation system which can simulate the transfer image by input of the exposure conditions and the design pattern. One part of the transfer image resulting from the simulation is indicated by numeral 34 of FIG. 4.

Figure 4A:
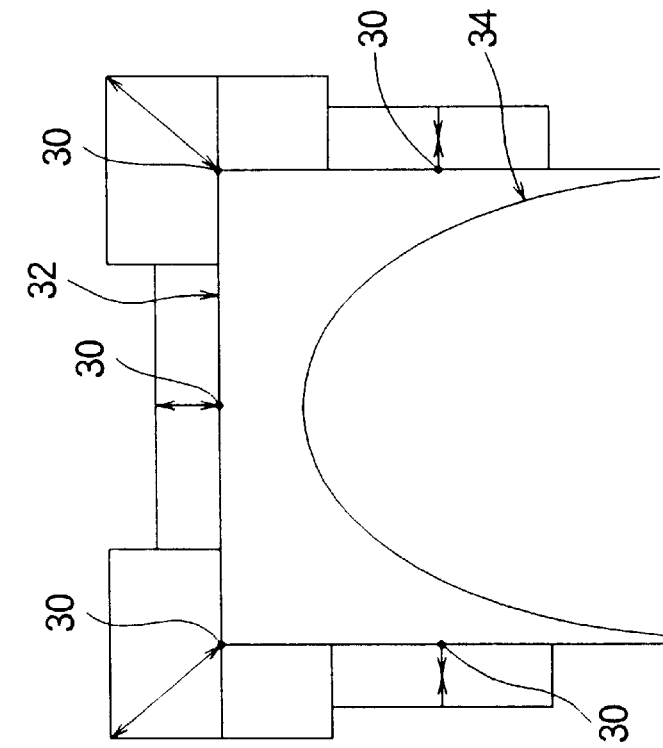
FIG. 4A is a schematic view of a method for measuring deviation of a resist edge for every evaluation point.

At step S13 shown in FIG. 2, a deviation (difference) of the resist edge with respect to the design pattern is calculated for each evaluation point 30 by the comparing means 12 shown in FIG. 1. The direction of measurement of the deviation of the resist edge position of the design pattern at this time is made the orthogonal direction with respect to a boundary line (edge) of the design pattern 32 as shown in FIG. 4A at positions other than the corners of the pattern, the outward direction of the design pattern 32 is defined as the positive direction and the inward direction thereof is defined as a negative direction. Further, at the corners of the design pattern 32, the direction of measurement of the deviation is made the direction of the sum of the directional vectors of the two sides constituting the corners, and similarly the outward direction of the pattern is determined to be the positive direction.

At step S14 shown in FIG. 2, the design pattern 32 is deformed and corrected by the deforming means 14 shown in FIG. 1 in accordance with the deviations (differences) compared for every evaluation point 30 so that the differences become smaller. A schematic view of the deforming and correcting method is shown in FIG. 4B.

Figure 4B:
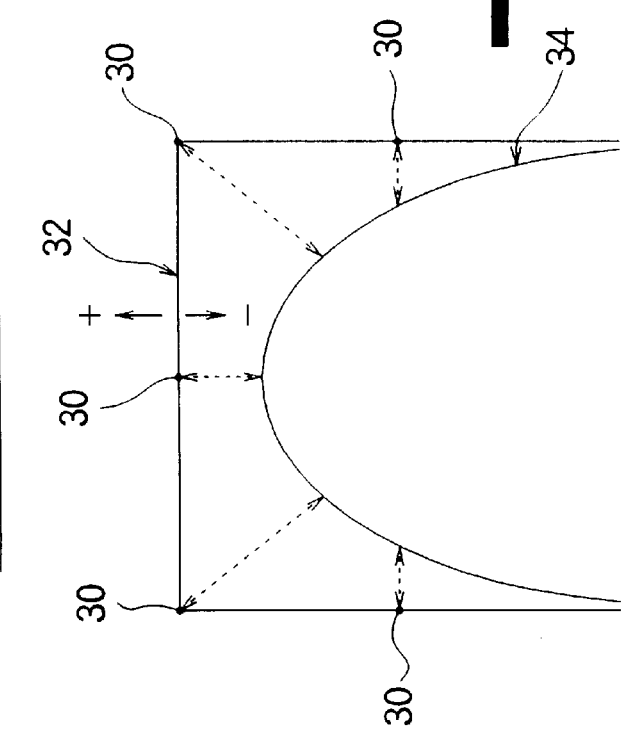
FIG. 4B is a schematic view of a step for correcting and deforming the mask pattern.
Figure 14:
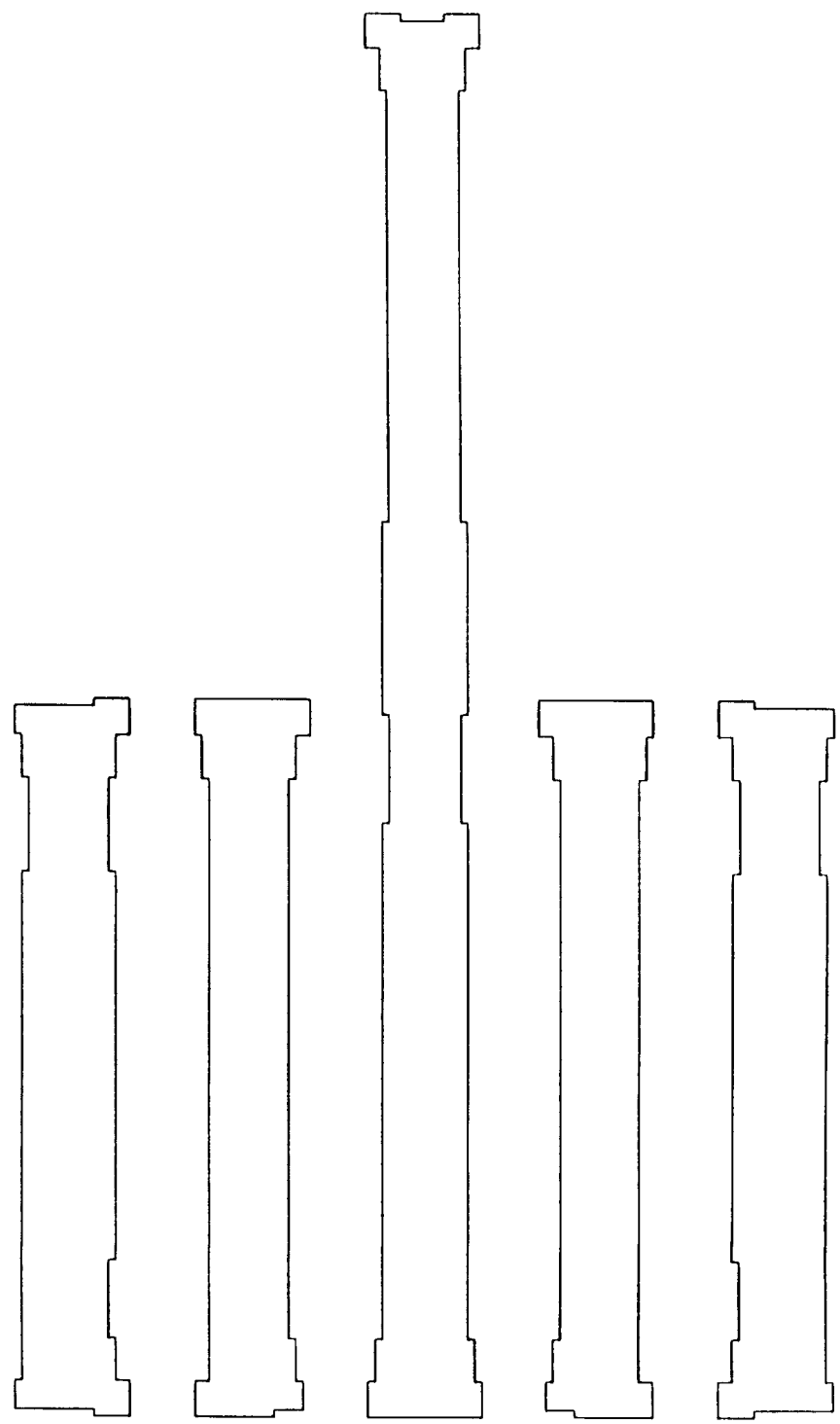
FIG. 14 is a plan view of an example of the mask pattern corrected in a plurality of repeat correcting steps.

As shown in FIGS. 4A and 4B, at the deformation and correction of the design pattern 32, the boundary lines (including not only the evaluation points, but also the boundary lines of the mask pattern in the vicinity of the evaluation points 30 are moved exactly by amounts obtained by multiplying the amounts of differences by a constant coefficient in a reverse direction of the deviations (differences) compared for every evaluation point 30. The coefficient is preferably larger than 0 and less than 1 and further preferably 0.10 to 0.50. When this coefficient is too large, an excessive deformation and correction occur, and there is an apprehension that the transfer image will not become closer to the design pattern but conversely will become more different from it even by the repeated calculation mentioned later. Note that, it is possible for the coefficient to be constant for all evaluation points or different for specific evaluation points. One example of a design pattern corrected in this way is shown in FIG. 14.

The corrected design pattern is stored in the correction pattern storing means 16 shown in FIG. 1. Where a good corrected pattern is obtained by the series of operations, at step S15 shown in FIG. 2, a corrected mask pattern is obtained. The corrected mask pattern is output onto the screen or sheet or film by the outputting means 20 shown in FIG. 1.

Note that, preferably, upon receipt of the signal of the repeating means 18 shown in FIG. 1, steps S12 to S14 shown in FIG. 2 are repeated at least one or more times by using the simulating means 10, the comparing means 12, and the deforming means 14 based on the corrected design pattern stored in the correction pattern storing means 16. At this time, the positions of the evaluation points 30 acting as the reference are not changed. Namely, based on the corrected design pattern, the transfer input is found again, deviation (differences) between that transfer image and the reference point is found, and the corrected design pattern is deformed and corrected again based on the difference. By repeating these operations, the transfer image will gradually approach the initial design pattern (positions of the evaluation points).

In the correction apparatus and correction method of the present example, the mask pattern of the photomask can be automatically deformed so as to obtain a transfer image near the desired design pattern without regard as to the design pattern. Accordingly, if photolithographic processing is carried out by using a photomask having a corrected design pattern obtained by the present example, a resist pattern which is near the initial design pattern as much as possible can be obtained, and bridging, disconnection, or the like do not occur. As a result, a semiconductor device with good electrical characteristics can be produced with a high manufacturing yield.

EXAMPLE 2

In the present example, the correction of the design pattern is carried out in a similar manner to the first example except the following means is used as the simulating means 10 shown in FIG. 1 performing step S12 shown in FIG. 2.

The simulating means 10 used in the present example is not a technique for simply finding the two-dimensional light intensity distribution based on the exposure conditions and design pattern and calculating the lines of the light intensity distribution above a predetermined threshold value as the transfer image.

As shown in FIG. 3, in the present example, the information concerning the design pattern (step S19) and the transfer conditions are simulated by the light intensity simulation (step S20). The two-dimensional light intensity distribution on the substrate, such as a semiconductor wafer, is found at step S21. Note that, it is also possible if the light intensity distribution is found by using an actual light intensity measuring device.

After the two-dimensional light intensity distribution is found, at step S22, the latent image-forming intensity is calculated. The latent image-forming intensity distribution is found at step S23.

Below, a detailed explanation will be made of the processing in the calculation of the latent image-forming intensity.

Figure 5:
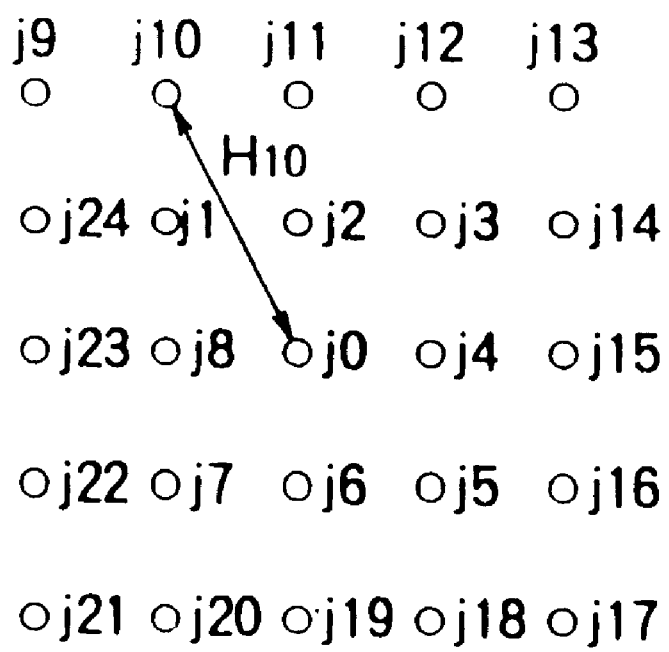
FIG. 5 is a view of a concept of part of the procedure shown in FIG. 4.

In the calculation of the latent image-forming intensity, for example, a latent image-forming intensity Mj0 at a point j0 on a wafer plane shown in FIG. 5 is determined by considering the influence of the light intensities at a point j0 and a point jn (n is an integer satisfying $0 \leq n \leq 24$) located at the periphery of the point j0. Here, the influence Mj0jn of the light intensity at the point jn is defined as in the following Equation (1):

$$M_{j0jn} = f(rn) * g(I(jn)) \quad (1)$$

In the above Equation (1), rn indicates a distance between the point j0 and the point jn, and f(rn) is indicated by the following Equation (2):

$$f(rn) = K * \exp(-rn^2/\alpha^2) \quad (2)$$

Note, in Equation (2), the following Equation (3) is satisfied. Namely, Equation (2) is defined by using a Gaussian function.

$$\int\int_{-\infty}^{\infty} K * \exp(-rn^2/\alpha^2) dx dy \quad (3)$$

Further, in Equation (1), g(I(jn)) is defined by the following Equation (4):

$$g(I(jn)) = I(jn) \quad (4)$$

Namely, the influence MjOjn of the light intensity at the point jn is a value obtained by multiplying the distance rn between the point j0 and the point jn by the light intensity I(jn) of the point jn.

In the calculation of the latent image-forming intensity, for example in the case shown in FIG. 5, the latent image-forming intensity Mj0 is found by cumulatively adding the influence MjOjn of the light intensity at the points jn with respect to the exposure energy at the points j0.

At this time, for example, the size of the wafer is infinite in the two-dimensional direction. When considering the influence of the light intensity from the infinite number of points jn ($-\infty \leq n \leq \infty$) arranged in a predetermined pattern, Mj0 is indicated by the following Equation (5):

$$M j0 = \int \int_{-\infty}^{\infty} M j0 jnd xd y \quad (5)$$
$$= \int \int_{-\infty}^{\infty} f(rn) * g(I(jn)) dx dy$$

Here, when Equations (2) and (4) are introduced into Equation (5), Mj0 is defined by Equation (6):

$$M j0 = \int \int_{-\infty}^{\infty} K * \exp(-rn^2/\alpha^2) * I(j) dx dy \quad (6)$$

In the calculation of the latent image-forming intensity, the Mj0 at the points arranged on a two-dimensional plane on the wafer in a predetermined pattern is calculated by the above procedure. The distribution of the latent image-forming intensity on a two-dimensional plane is found based on the result of the calculation.

Next, the contour lines with which the latent image-forming intensity becomes the threshold value are found at step S24 shown in FIG. 3 in the distribution of the latent image-forming intensity found by the above procedure. The pattern defined by the contour lines is used as the resist pattern at step S25. At this time, the threshold value is determined in accordance with for example the amount of exposure and the development conditions.

An example of the optimum calculation method of the threshold value Eth and the constant α used in the simulation will be shown next.

Figure 6:
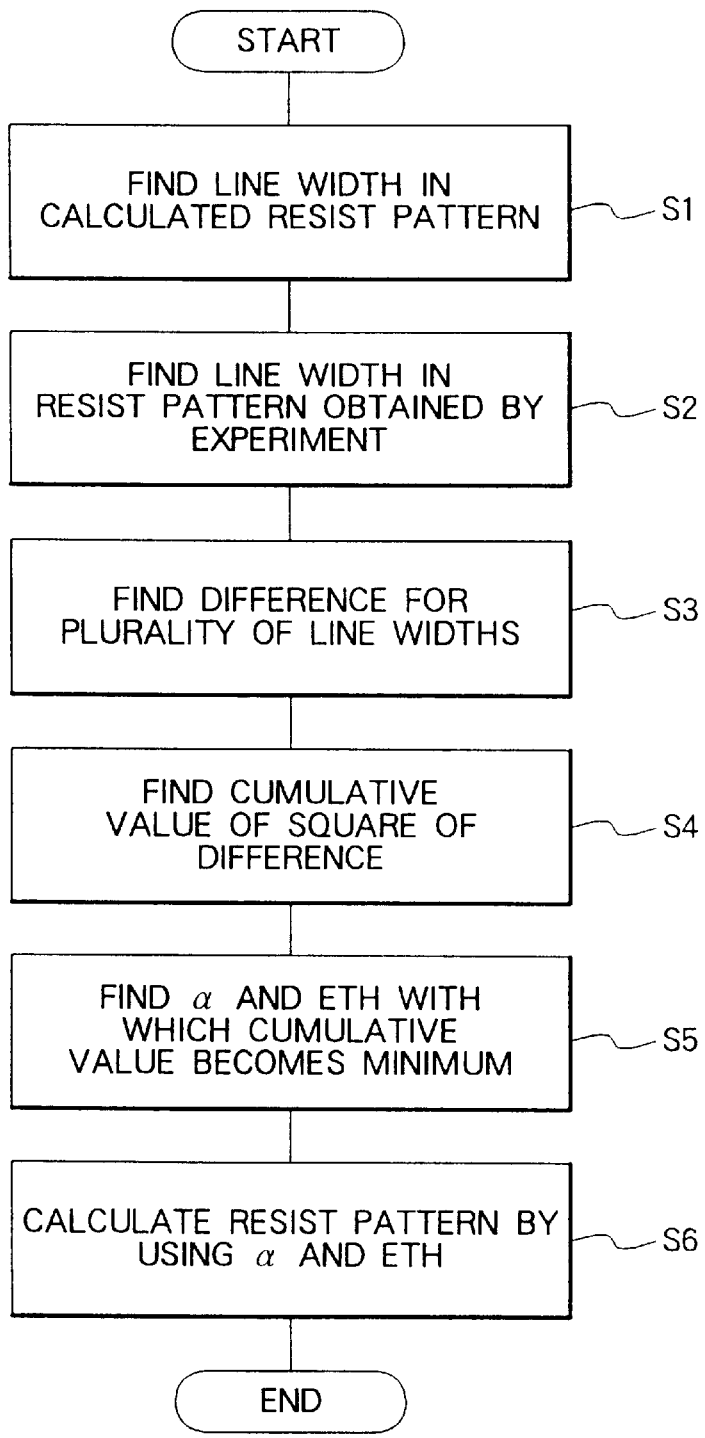
FIG. 6 is a flow chart of an example of a method of finding a threshold value Eth and constant α used in the calculation of the latent image-forming intensity.
Figure 7A:
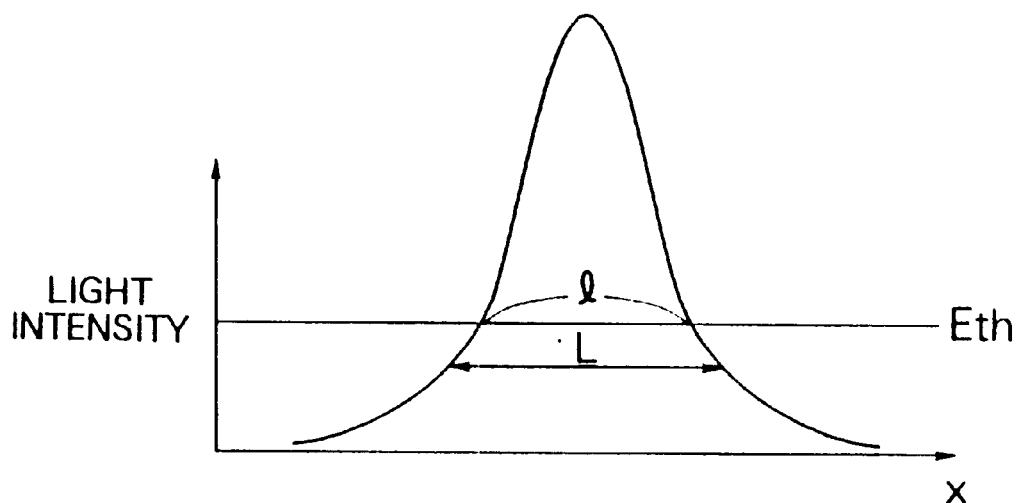
FIGS. 7A and 7B are schematic views showing that where the two-dimensional light intensity distribution is simply sliced at the threshold value, it does not always coincide with the actual pattern line width.
Figure 7B:
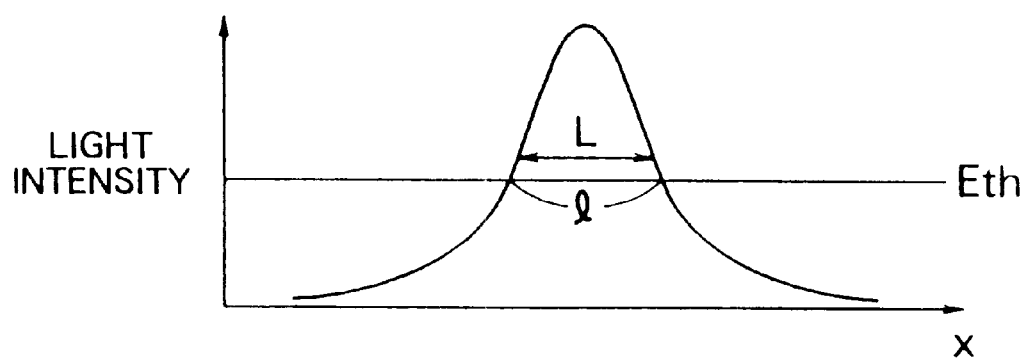

A plurality of resist patterns are calculated based on various exposure times and defocused conditions. The processing shown in FIG. 6 is carried out by using the calculated resist patterns.

Here, the latent image-forming intensity R(x,y) in the latent image-forming intensity distribution is defined by for example the following Equation (7). In Equation (7), α is a constant.

$$R(xy) = \int \int_{-\infty}^{\infty} e^{-x-x0)^2+(y-y0)^2/\alpha} * E(x0, y0) dx0 dy0 \quad (7)$$

Step S1: In the resist pattern calculated by the simulation method shown in FIG. 3, line widths are found at a plurality of positions. At this time, the line in question is given a wide range of line widths.

Step S2: A transfer experiment is actually carried out by using the mask pattern and exposure conditions the same as those of this simulation method, and the line width of the line corresponding to the line in question at step S1 is found.

Step S3: The difference in the line widths of the plurality of lines found at steps S1 and S2 by the method of calculation of the resist pattern and the transfer experiment is found.

Step S4: The squared value of the difference found at step S3 is found. This squared value is cumulatively added for a plurality of lines to find a cumulative value.

Step S5: The constant α and the threshold value Eth giving the smallest cumulative value found at step S4 are calculated. At this time, the simulation shown in FIG. 3 and processing of steps S1 to S4 of FIG. 6 are carried out by using for example the predetermined constant α and the threshold value Eth as an initial value, the cumulative value of step S4 shown in FIG. 6 in the previous processing and the cumulative value of step S4 in the current processing are compared, and the constant α and the threshold value Eth used for the processing to be carried out next are determined so that the difference of these cumulative values is made smaller. Then, by using this constant α and the threshold value Eth, the simulation of FIG. 3 and the processing of steps S1 to S4 of FIG. 6 are carried out again. This procedure is repeated so as to find the constant α and the threshold value Eth giving the minimum difference of the cumulative values.

Step S6: The simulation shown in FIG. 3 mentioned before is carried out by using Equation (7) in which the constant α and Eth are made the values calculated at step S5.

Using the method shown in FIG. 6, it is possible to suitably set the constant α and Eth in the above Equation (7) for performing the simulation shown in FIG. 3. For this reason, the accuracy of the simulation shown in FIG. 3 can be further improved.

Note that, in the above Example 2, it is also possible if the contact α and the Eth are calculated so that the maximum value of the difference of the line widths between the resist pattern obtained by the resist pattern calculating method and the resist pattern found by the experiment becomes the smallest for the line widths at a plurality of corresponding positions.

Further, in the present example, the case of using a Gaussian function in Equations (2) and (3) used in the calculation of the latent image-forming intensity (step S22 shown in FIG. 3) was explained by way of an example, but this function is not particularly limited so far as it becomes the maximum when the distance rn is zero and becomes zero when the distance rn is infinitely large.

Further, in the present example, in the calculation of the latent image-forming intensity of step S22 shown in FIG. 3, the latent image-forming intensity was defined by using the product of the light intensity and the distance, but it is also possible if the latent image-forming intensity is defined by the product of a power of the light intensity and the distance.

In this case, the latent image-forming intensity Mj0 is defined by for example the following Equation (8).

$$M j0 = \int \int_{-\infty}^{\infty} K * \exp(-rn^2/\alpha^2) * I(j)^2 dx dy \quad (8)$$

Further, in the present example, a case where the exposure was carried out by using an i-ray was explained by way of example, but the present invention can also be applied to the case where the pattern formation is carried out by using for example an X-ray or electron beam (EB).

In the present example, the distribution of the latent image-forming intensity used when finding the resist pattern was determined by considering not only the light intensity of the point noted, but also the influence by the light intensity of the points on its periphery, therefore a more correct calculation of the resist pattern (transfer image) can be carried out.

Next, the fact that a result near the actual transfer resist pattern is obtained by performing the simulation shown in FIG. 3 is shown.

In this example, the constant α in Equation (6) was defined as 0.131 and Eth was defined as 197.01.

Further, in this example, in an L/S transfer experiment, the exposure was actually carried out for an i-ray positive resist of a company A by using an i-ray having a wavelength λ of 365 nm and under an exposure condition of a numerical aperture NA of 0.50 and an apparent size σ of 0.68 while changing the defocused condition and exposure time.

Figures 8A, 8B:
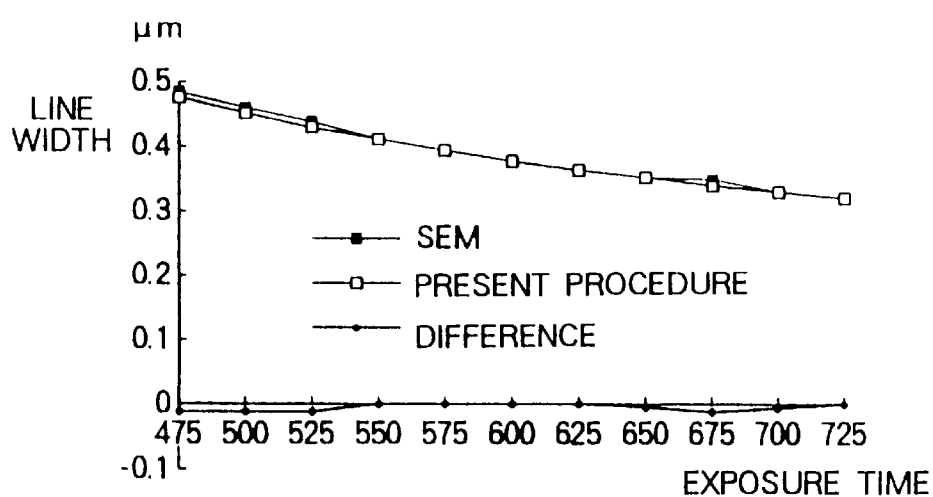
FIG. 8A is a correspondence table of a line width (SEM) found in an L/S transfer experiment at different defocused conditions and exposure times, the line width (present procedure) found by using a method of simulation according to the embodiment and a difference between the line width (present procedure) and the line width (SEM)
FIG. 8B is a graph in which the line width (present procedure) and line width (SEM) shown in FIG. 8A are plotted on an ordinate and the exposure time is plotted on an abscissa.

FIG. 8A is a correspondence table of the line width (measured by SEM: Scanning type Electron Microscope) found in the L/S transfer experiment at different defocused conditions and exposure times, the line width (present procedure) found by using the resist pattern calculating method of this example, and the difference between the line width (present procedure) and the line width (SEM).

FIG. 8B is a graph in which the line width (present procedure) and the line width (SEM) shown in FIG. 8A are plotted on the ordinate and the exposure time is plotted on the abscissa.

From the results of the experiment shown in FIG. 8A, 3σ became equal to 0.0153 in the present example.

Contrary to this, a resist pattern was prepared by using the conventional resist pattern calculating method not using the calculation of the latent image-forming intensity. At this time, when finding the resist pattern from the distribution of the light intensity, the threshold value Eth was determined to be 193.54.

Further, in the present comparative example, in the L/S transfer experiment, the exposure was actually carried out for an i-ray positive resist of the company A by using an i-ray having a wavelength λ of 365 nm and under exposure conditions of a numerical aperture NA of 0.50 and an apparent size σ of 0.68 while changing the defocused conditions and exposure times.

Figures 9A, 9B:
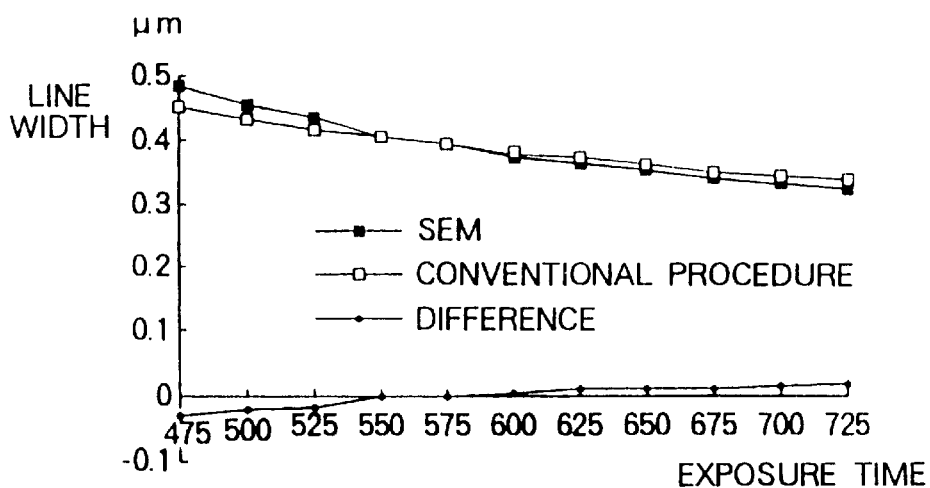
FIG. 9A is a correspondence table of a line width (SEM) found in an L/S transfer experiment at different defocused conditions and exposure times, the line width (conventional procedure) found by using a method of simulation according to the comparative example and a difference between the line width (conventional procedure) and the line width (SEM)
FIG. 9B is a graph in which the line width (conventional procedure) and line width (SEM) shown in FIG. 9A are plotted on the ordinate and the exposure time is plotted on the abscissa.

FIG. 9A is a correspondence table of the line width (SEM) found in the L/S transfer experiment at different defocused conditions and exposure times, the line width (conventional procedure) found by using the resist pattern calculating method of the present comparative example, and the difference between the line width (conventional procedure) and the line width (SEM).

FIG. 9B is a graph in which the line width (conventional procedure) and the line width (SEM) shown in FIG. 9A are plotted on the ordinate and the exposure time is plotted on the abscissa.

From the results of the experiment shown in FIG. 9A, 3σ became equal to 0.0313 in the present comparative example.

When comparing the results shown in FIGS. 8A and 8B (present example) and the results shown in FIGS. 9A and 9B (comparative example), it was confirmed that the 3σ according to the present example was about a half of that of the comparative example and that the precision of the simulation shown in FIG. 3 was good.

EXAMPLE 3

In the present example, the design pattern was corrected in a similar manner as with Example 1 or Example 2 except target points were set in addition to the evaluation points at step S11 shown in FIG. 2 carried out by the evaluation point arranging means 8 shown in FIG. 1.

Below, an explanation will be made of only the portions different from that of the examples mentioned before.

Figure 10:
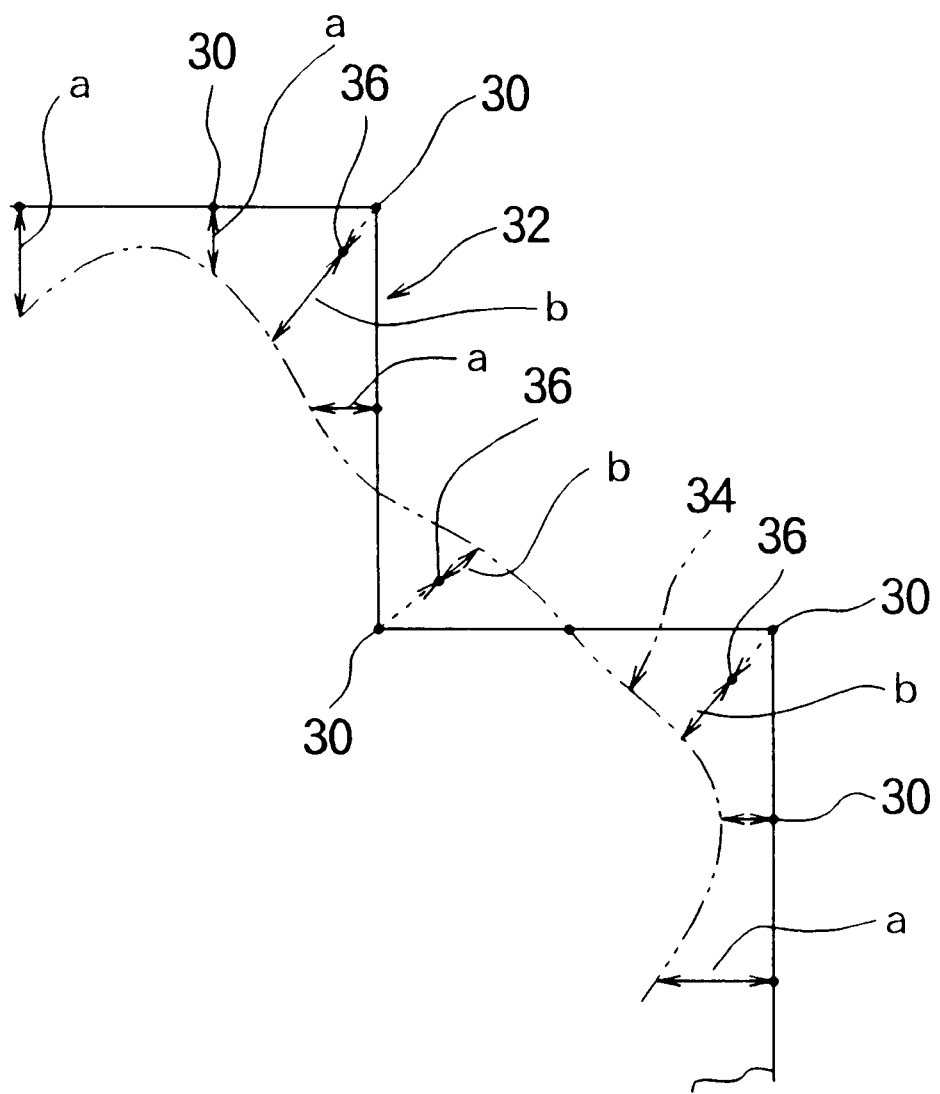
FIG. 10 is a schematic view of a method of setting a target point according to the embodiment.

In the present example, as shown in FIG. 10, a target point 36 is set corresponding to an evaluation point 30 located in a projecting corner or a recessed corner of a design portion 32. The target point 36 is set inside of the corner (for example −0.08 μm) in the case of a projecting corner, and the target point 36 is set outside of the corner portion (for example +0.08 μm) in case of a recessed corner.

In the present example, in the comparing step of step S13 shown in FIG. 2 the difference a between the simulated transfer image 34 and the design pattern 32 is compared for every evaluation point 30 at the positions where only the evaluation points 30 are set and the difference b between the target point 36 and the transfer image 34 is compared at the positions where the target points 36 are set. Then, in the deforming step of step S14 shown in FIG. 2, the design pattern 32 is deformed according to the differences a and b compared for every evaluation point 30 or every target point 36 so that the differences become smaller with the evaluation points 30 (not the target points) as the reference.

For example, in the case of a projecting corner or a recessed corner of the design pattern 32, when evaluation points 30 are located at these corners, if the correction of the mask pattern were carried out to make the transfer image approach the evaluation points 30 per se, there would be the apprehension that the transfer image will move away from the design pattern 32 at the positions other than the corner portions.

In the method of correction of the mask pattern according to the present example, for example, since the target points 36 are set inside of the corners in the case of projecting corners, the target points 36 are set outside of the corners in the case of recessed corners, and the design pattern 32 is corrected so that the transfer image 34 approaches these target points 36, the transfer image 34 can be brought closer to the design pattern in an excellent manner. As a result, bridging, disconnection, or the like between parts of the pattern can be effectively prevented.

EXAMPLE 4

In the present example, the design pattern was corrected in a similar manner as Example 1, Example 2, or Example 3 except the simulation carried out at step S12 shown in FIG. 2 was carried out under a plurality of transfer conditions by using the simulating means 10 shown in FIG. 1.

Below, an explanation will be made of only the portions different from those of the examples mentioned before.

Namely, in the present example, in the simulation step, transfer images are simulated by using a plurality of transfer conditions based on the combination of a plurality of amounts of exposure of a preliminarily set exposure margin and a plurality of focal positions within a range of a preliminarily set depth of focus so as to obtain a plurality of transfer images. Then, in the comparing step of step S13 shown in FIG. 2, the difference from the design pattern is compared for every evaluation point for each of the plurality of transfer images so as to calculate a plurality of differences for every evaluation point. Then, in the deforming step of step S14 shown in FIG. 2, the design pattern is deformed so that the plurality of differences for every evaluation point become smaller compared with a predetermined reference.

The predetermined reference in the deforming step is for example a reference that gives the smallest average value of the plurality of differences for every evaluation point.

Further, as another predetermined reference, a reference that gives the smallest difference between the maximum difference and the minimum difference among the plurality of differences for every evaluation point may be mentioned.

Further, as still another predetermined reference, a reference that gives the smallest square average of the plurality of differences for every evaluation point may be mentioned.

By the method of correction of the mask pattern according to the present example, since transfer images of transfer conditions changed within the range of the processing margin are considered (processing margin is considered), the processing margin such as the exposure margin or depth of focus is no longer deteriorated based on the corrected mask pattern. As a result, if the photolithography is carried out by using the photomask of this mask pattern, the manufacturing yield is improved.

EXAMPLE 5

In the present example, the invention is applied to a case where a pattern of a 0.32 μm rule is exposed under conditions of an exposure wavelength λ of 365 nm, a numerical aperture NA of 0.5, and an apparent size σ of 0.68.

FIG. 11 shows the design pattern used in the present example.

Figure 12:
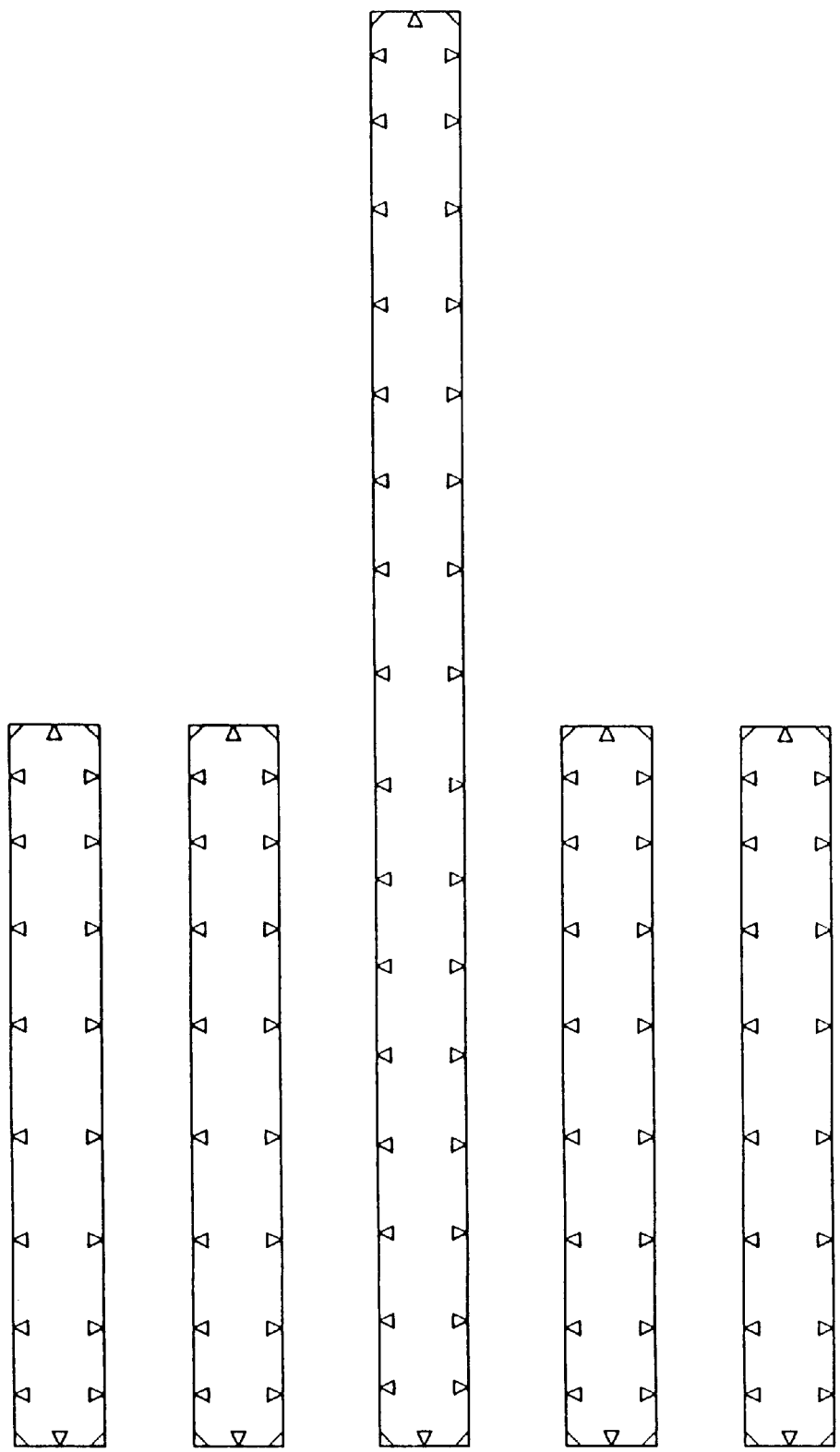
FIG. 12 is a plan view of one example of the method of arranging evaluation points.

First, as shown in FIG. 12, evaluation points were arranged at all corners of the design pattern. A predetermined number of further evaluation points were added to the sides of the pattern at predetermined small intervals starting from the corners, then further evaluation points were arranged at the sides at predetermined large intervals in the remaining areas far from the corners. The small interval of the evaluation points was about 0.16 μm and the large interval was about 0.32 μm.

Figure 13:
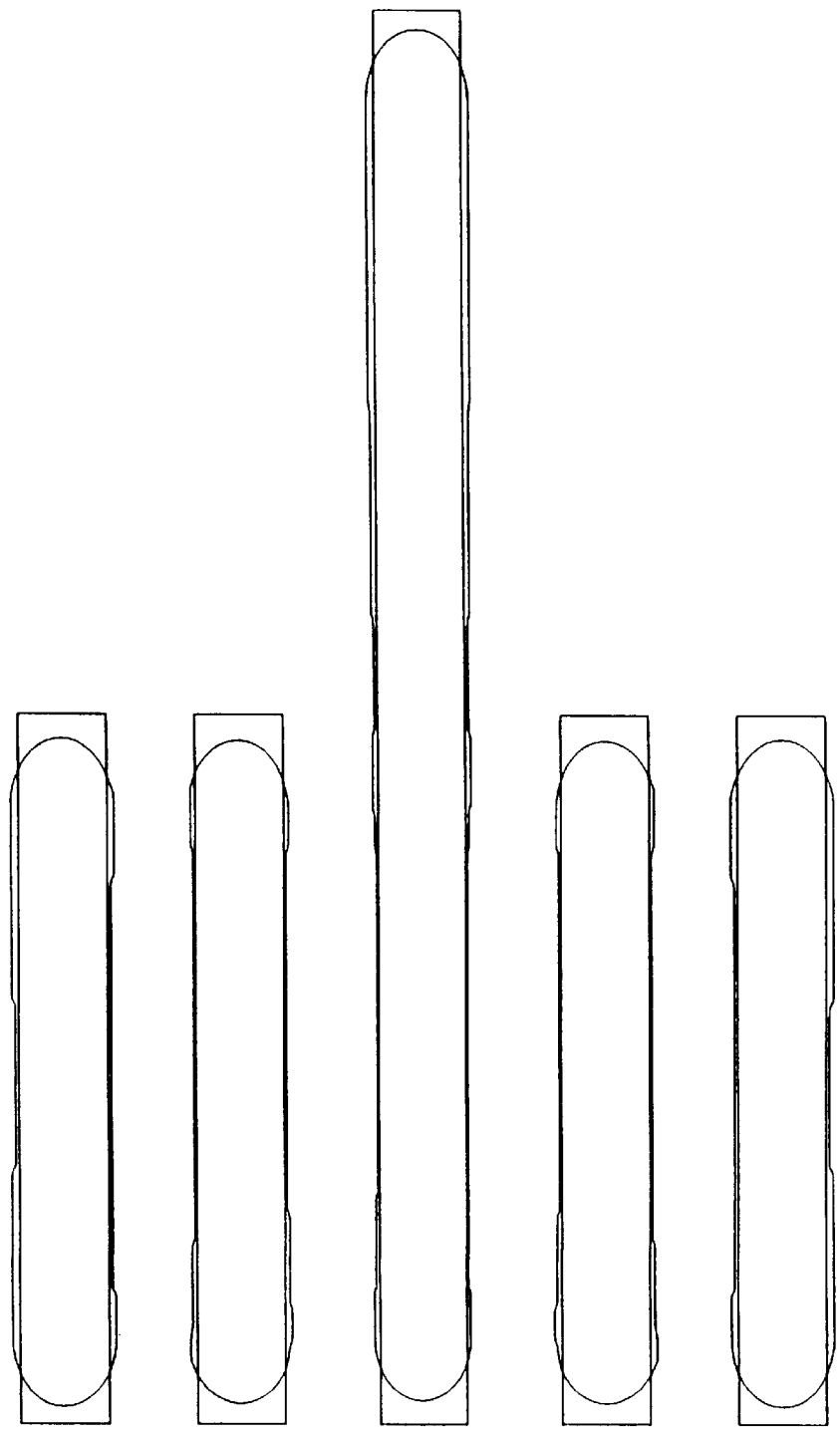
FIG. 13 is a plan view of a pattern showing a result of simulation under a focused condition.

Next, the distribution of light intensity obtained when a mask of this design pattern was transferred as is under a focused condition was found. The contour lines sliced at the threshold value Eth were found as the resist image (FIG. 13). Note, the threshold value Eth is set so that L in FIG. 13 becomes 0.32 μm.

Subsequently, the amount of deviation of the resist edge position from the evaluation point was found with respect to the edges (corners and sides) of the resist image at all evaluation points. At the evaluation points other than the corners, as shown in FIG. 4, the direction of measurement of the deviation of the edge position at this time was made the orthogonal direction with respect to the edge and the outward direction of the pattern was made the positive direction. At the corner points, this was made the direction of the sum of the directional vectors of the two sides forming the corner, and similarly the outside of the pattern was made the positive direction.

Note, at the corner evaluation points, in order to prevent excessive correction of the pattern later, the target value of the amount of deviation of the edge was made −0.07 μm for the outwardly projecting corners and was made +0.07 μm for the outwardly recessed corners and the difference of these target values and the amount of deviation of the evaluation point of the edge position was found.

In this way, the side of the mask pattern in the vicinity of each evaluation point was moved in a reverse direction to the obtained amount of deviation of the edge so as to obtain the corrected mask pattern. Here, the amount of movement of the sides of the pattern was made an amount obtained by multiplying the amount of deviation by 0.25.

Further, these procedures were carried out again by maintaining the position of the evaluation point as is and making the corrected mask pattern the pattern input.

By repeating this procedure four times, the mask pattern of FIG. 14 was obtained.

Figure 15:
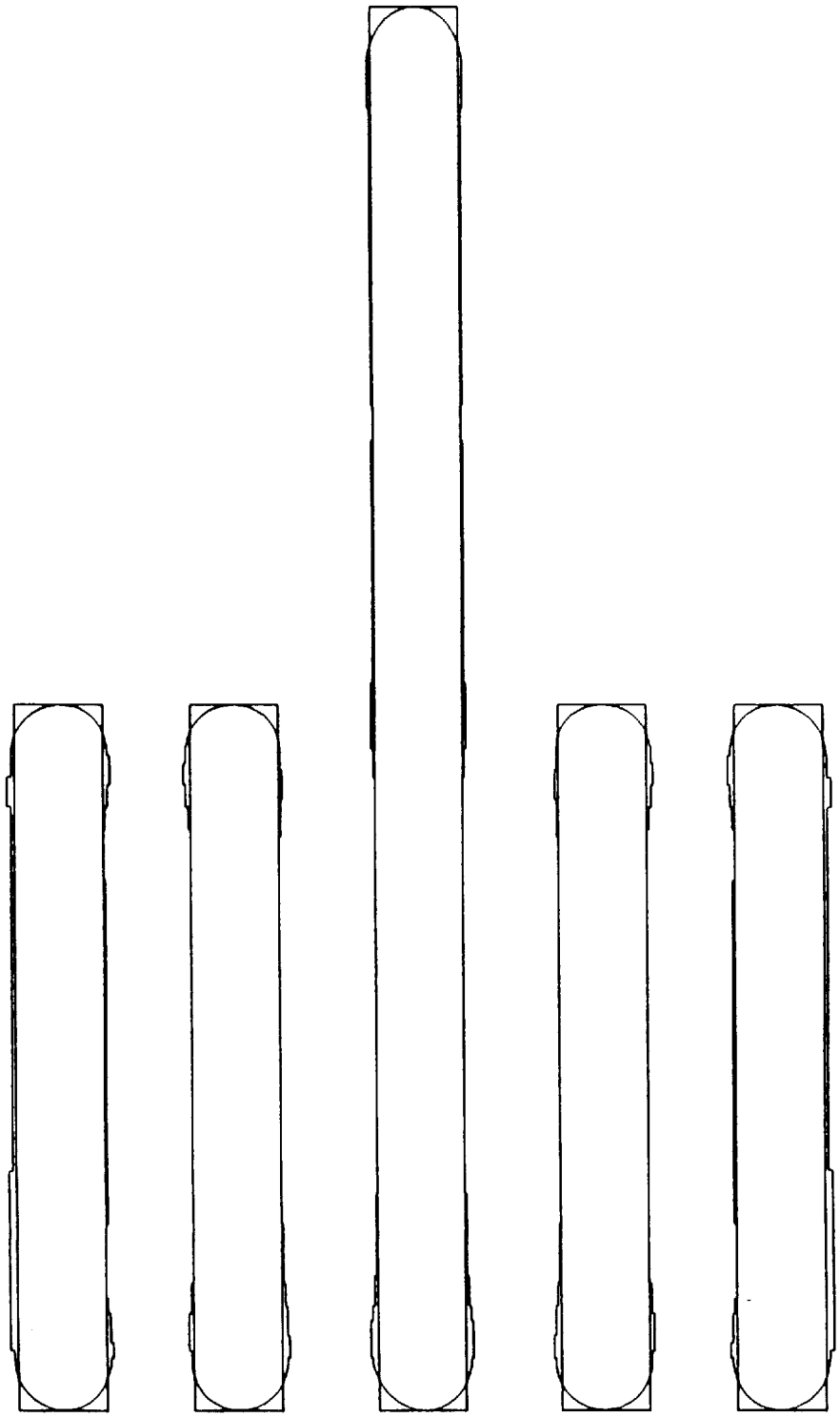
FIG. 15 is a plan view of a transfer image simulated under a focused condition by using the corrected mask pattern shown in FIG. 14.

By this correction, it was possible to successfully reduce the 3σ of the edge deviation at each evaluation point, which was 0.101 μm if the mask was the design pattern as it was, to 0.034 μm. The resist pattern under a focused condition obtained by the mask of FIG. 14 is shown in FIG. 15. It shows that a very good resist pattern is obtained in comparison with FIG. 13 before the correction.

By using the present mask, a semiconductor device having good electrical characteristics can be produced with a high manufacturing yield.

Comparative Example 1

In Comparative Example 1, processing for correction of the mask pattern was carried out in a similar manner to Example 5 except that, in the method of arranging the evaluation points of the above Example 5, the evaluation points were arranged along the edge of the pattern at constant intervals of about 0.16 μm.

Figure 16:
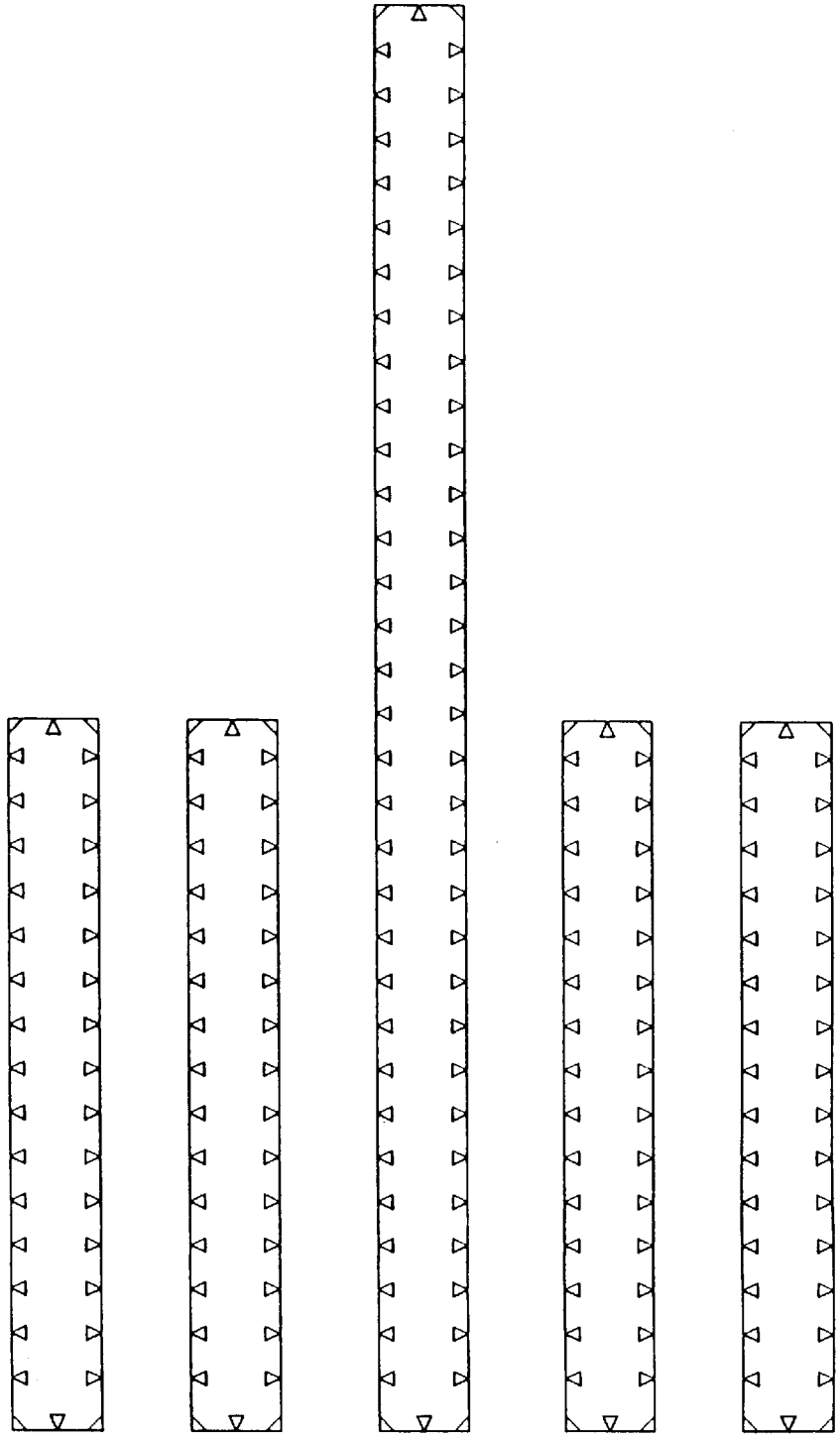
FIG. 16 is a plan view of a method of arranging evaluation points according to Comparative Example 1.
Figure 17:
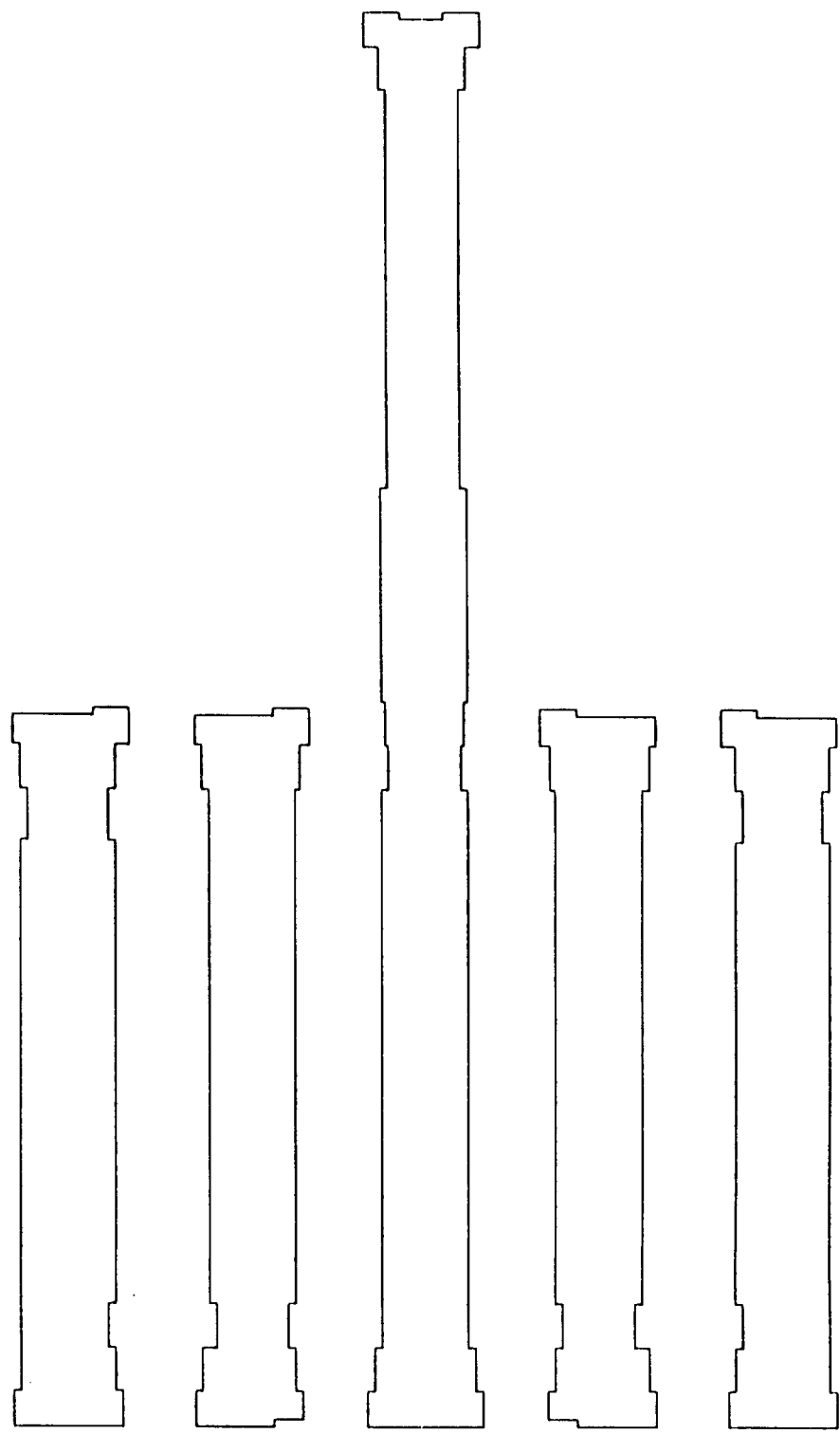
FIG. 17 is a plan view of one example of the corrected mask pattern obtained in Comparative Example 1.
Figure 18:
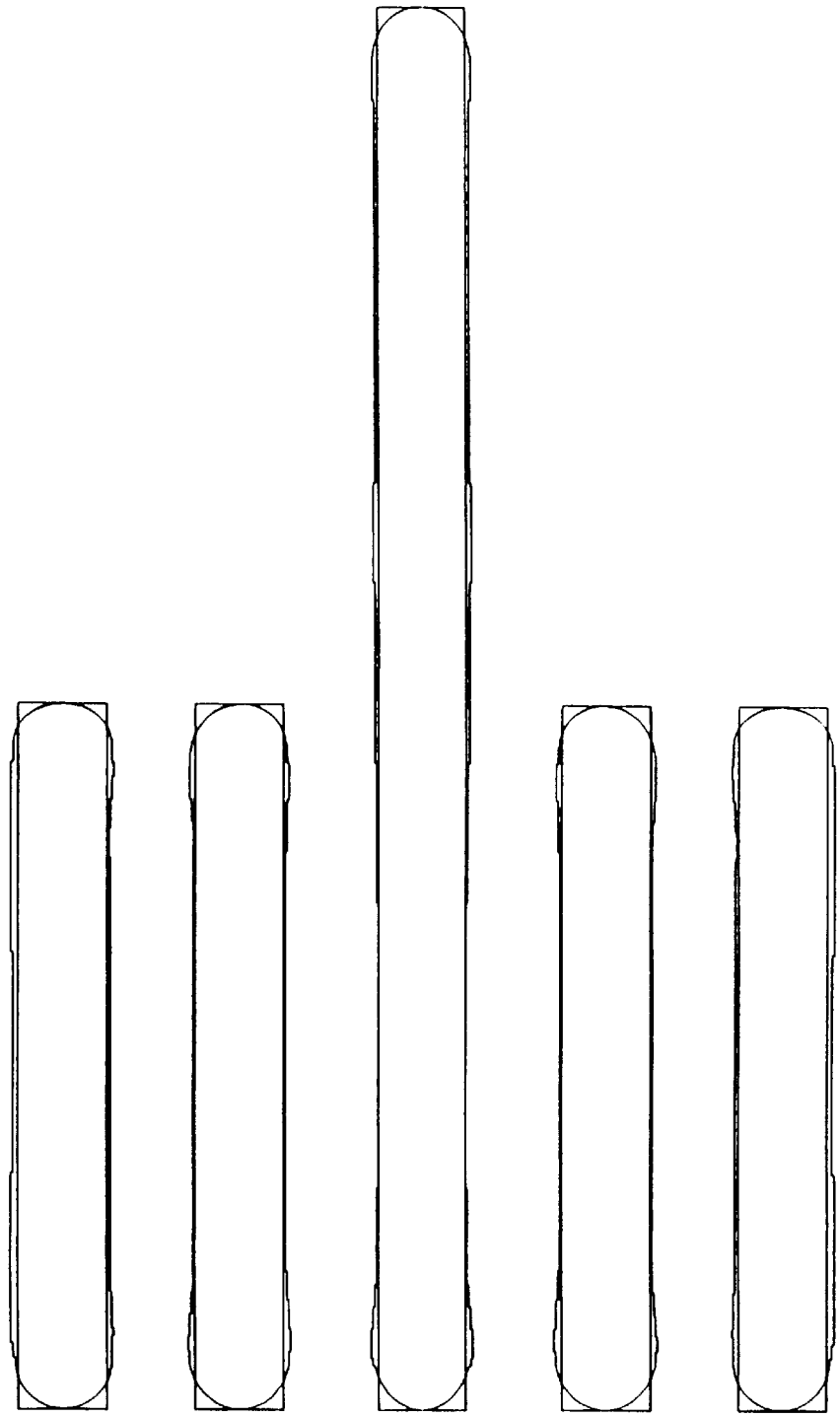
FIG. 18 is a plan view of a transfer image simulated under a focused condition by using the corrected mask pattern shown in FIG. 17.

FIG. 16 shows the evaluation points added to the design pattern; FIG. 17 shows the mask pattern obtained by the correction; and FIG. 18 shows the transfer resist pattern.

When comparing Example 5 and Comparative Example 1, an equivalent transfer image is obtained, but the number of the evaluation points is smaller in Example 5 and therefore the calculation time becomes shorter. Also, the number of shapes used in the mask is reduced. In this way, by using the technique shown in the example, it is possible to correct the light proximity effect at a low cost.

EXAMPLE 6

In Example 6, the invention is applied to a case where a pattern of a 0.35 μm rule is exposed under conditions of an exposure wavelength λ of 365 nm, a numerical aperture NA of 0.50, and an apparent size σ of 0.68.

Figure 19:
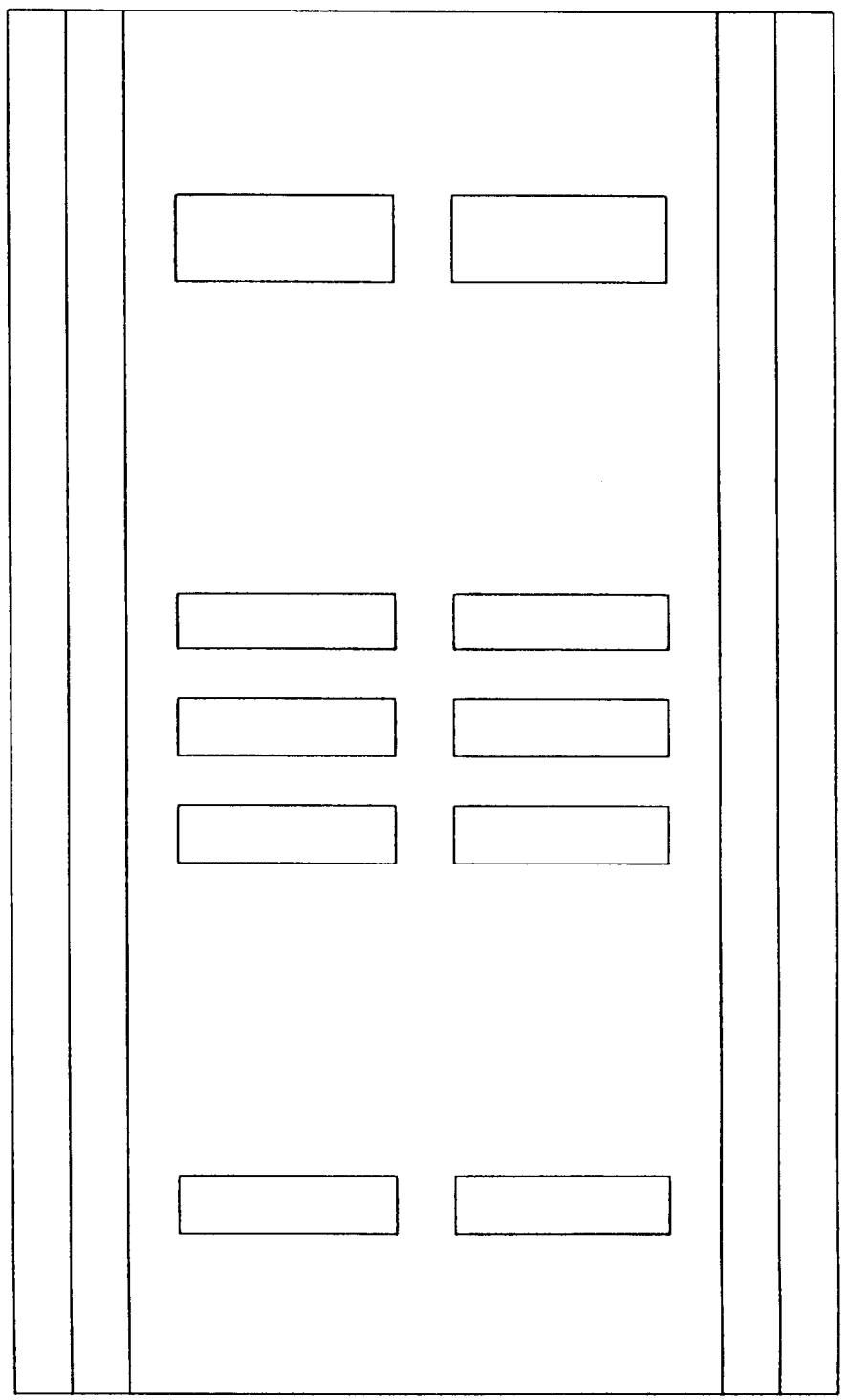
FIG. 19 is a plan view of an initially set design of another embodiment of the present invention.

FIG. 19 shows the design pattern used in the present example.

Figure 20:
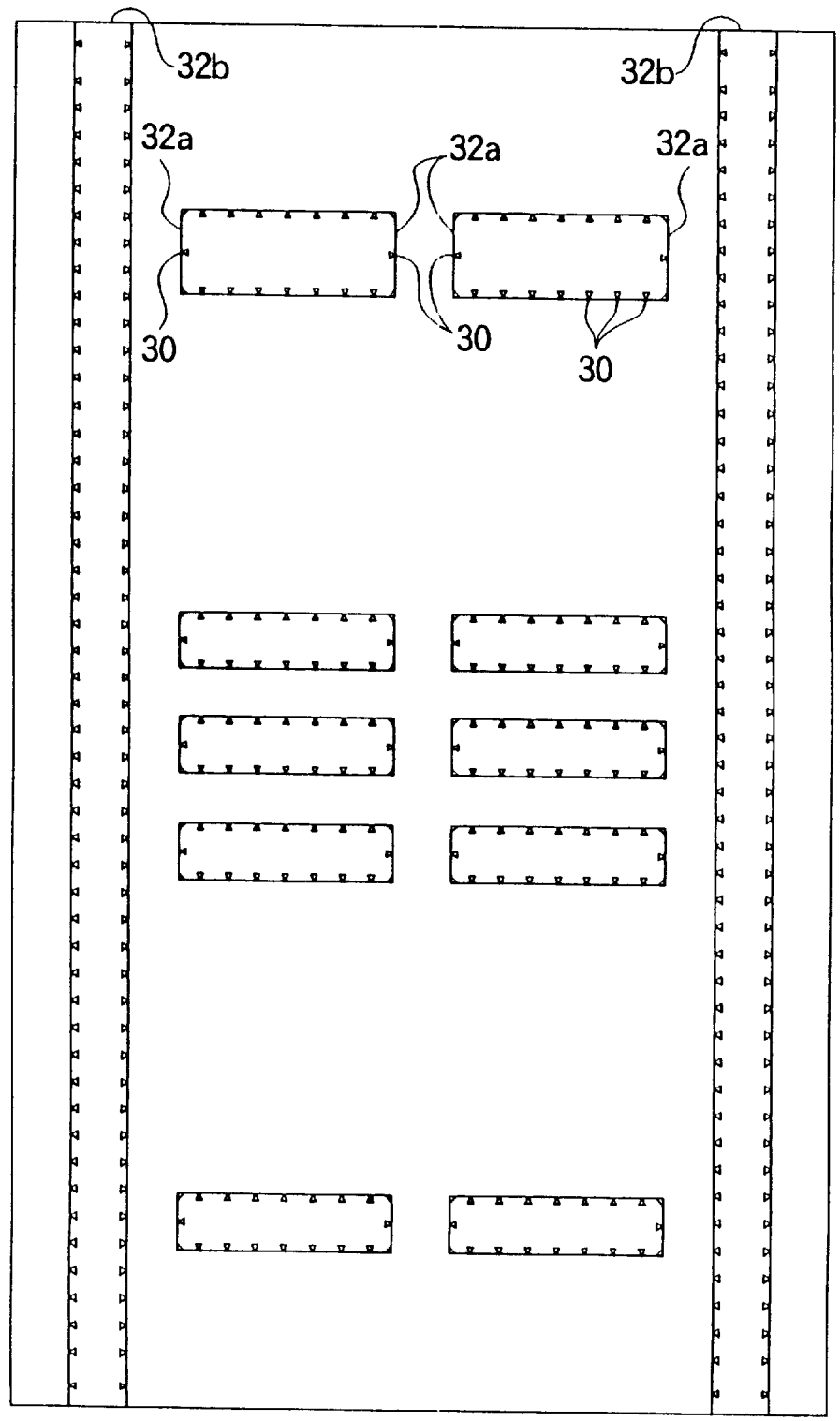
FIG. 20 is a plan view of another example of the method of arranging the evaluation points.

First, as shown in FIG. 20, the evaluation points were generated for the sides of the design pattern. At this time, evaluation points 30 were respectively arranged at the corners of the pattern, further evaluation points 30 were added to the substantially midpoints of the short sides 32a of the pattern shorter than a predetermined width, and further evaluation points 30 were arranged at predetermined intervals at the other sides of the pattern. In this case, the predetermined width was about 0.53 μm.

Further, at the time of arrangement of the evaluation points, no evaluation points were arranged at the boundaries 32b of the repeat regions of the pattern.

Figure 21:
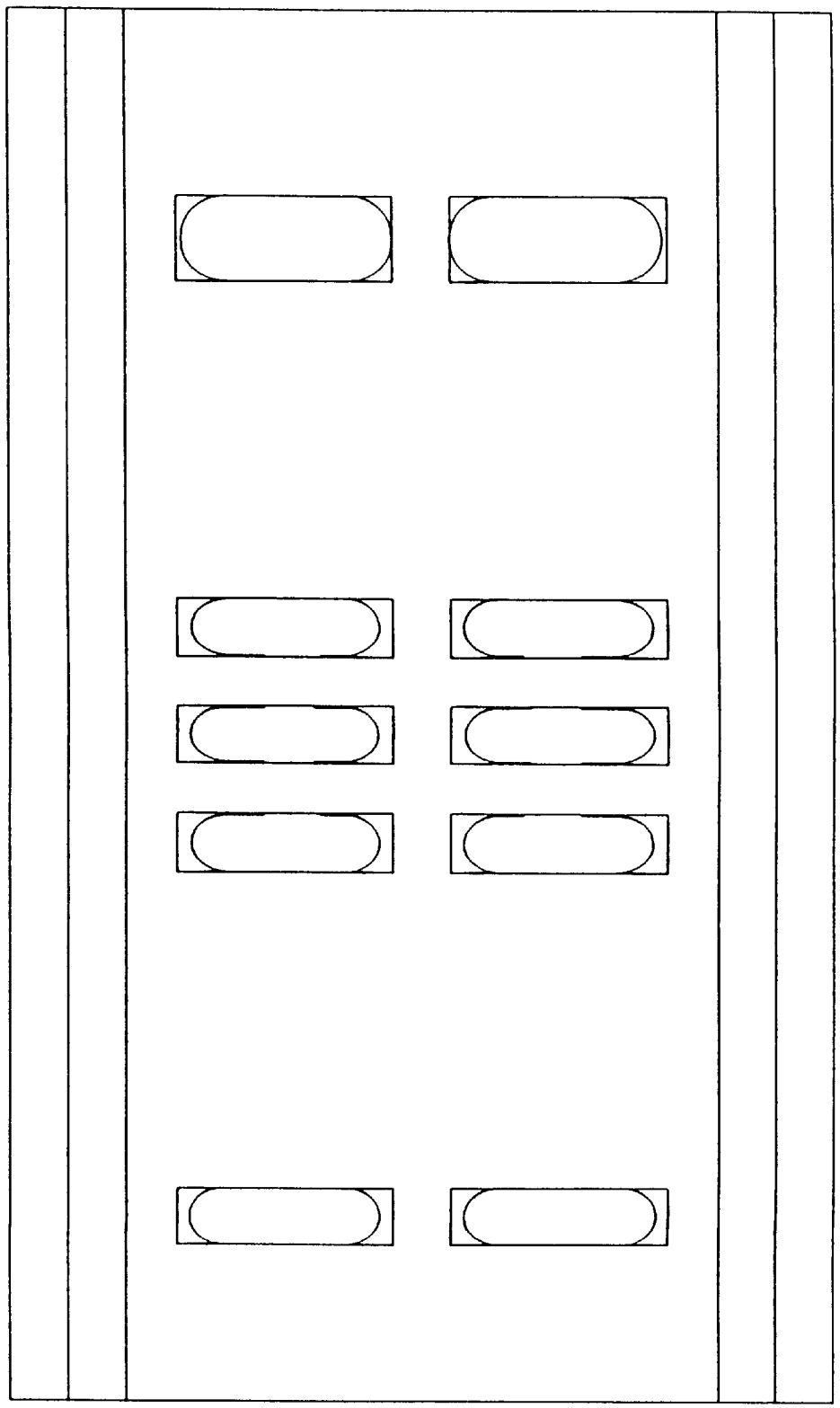
FIG. 21 is a plan view of the pattern showing the result of simulation under a focused condition.

Next, the distribution of light intensity obtained when the mask of this design pattern was transferred as is under a focused condition was found, and the contour lines sliced at the threshold value Eth were found as the resist image (FIG. 21). Note, the threshold value Eth is set so that L in FIG. 21 becomes 0.4 μm.

Subsequently, the amount of deviation of the resist edge position from the evaluation point was found with respect to the edges (corners and sides) of the resist image at all evaluation points. At the evaluation points other than the corners, the direction of measurement of the deviation of the edge position at this time was made the orthogonal direction with respect to the edge and the outward direction of the pattern was made the positive direction. At the corner points, this was made the direction of the sum of the directional vectors of the two sides forming the corner, and similarly the outside of the pattern was made the positive direction.

Note, at the corner evaluation points, in order to prevent excessive correction of the pattern later, the target value of the amount of deviation of the edge was made −0.07 μm for the outwardly projecting corners and was made +0.07 μm for the outwardly recessed corners and the difference of these target values and the amount of deviation of the evaluation point of the edge position was found.

In this way, the side of the mask pattern in the vicinity of each evaluation point was moved in a reverse direction to the obtained amount of deviation of the edge so as to obtain the corrected mask pattern. Here, the amount of movement of the sides of the pattern was made an amount obtained by multiplying the amount of deviation by 0.35.

Further, these procedures were carried out again by maintaining the position of the evaluation point as is and making the corrected mask pattern the pattern input.

Figure 22:
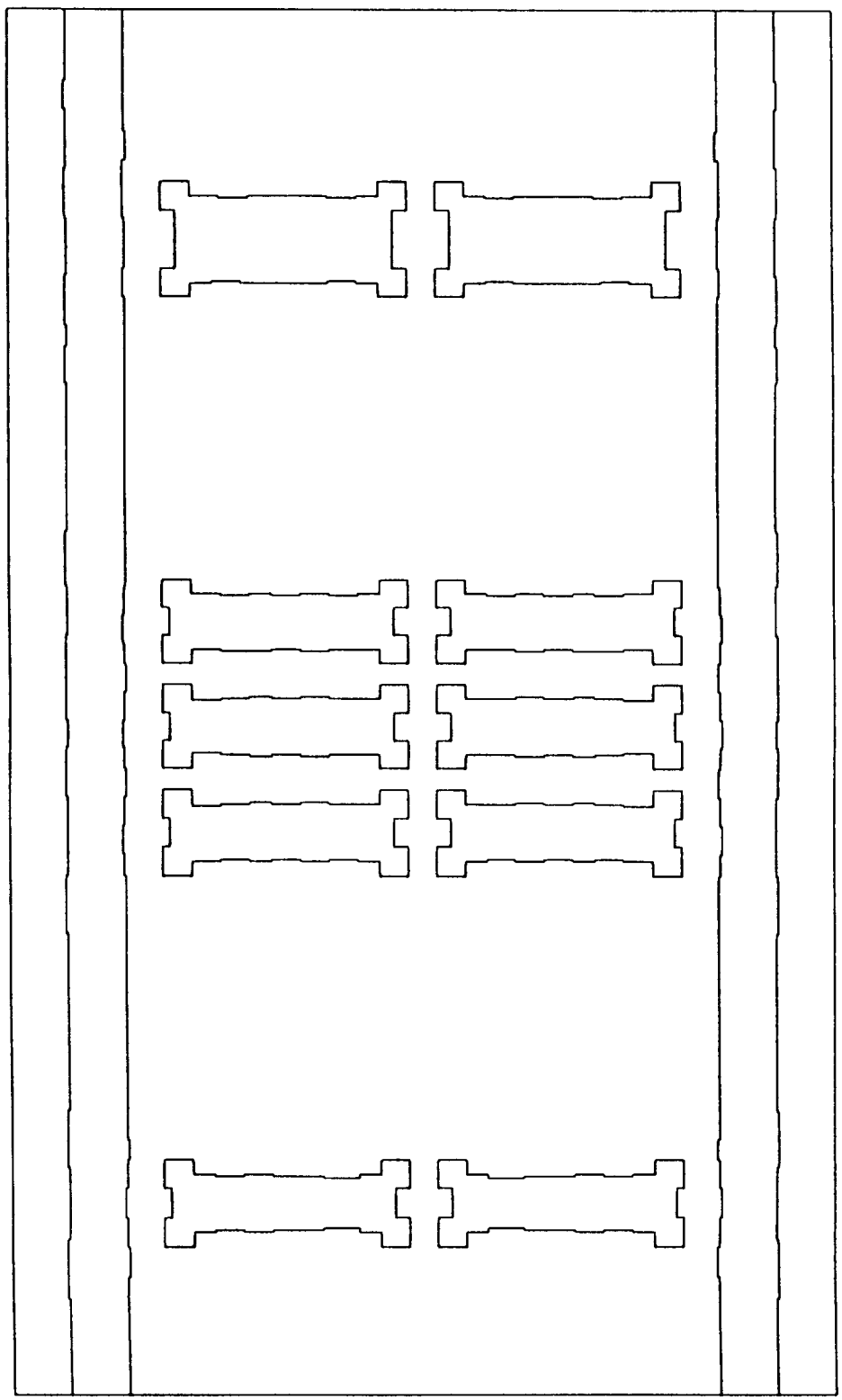
FIG. 22 is a plan view of an example of the mask pattern corrected in a plurality of repeat correcting steps.

By repeating this procedure 10 times, the mask pattern of FIG. 22 was obtained.

Figure 23:
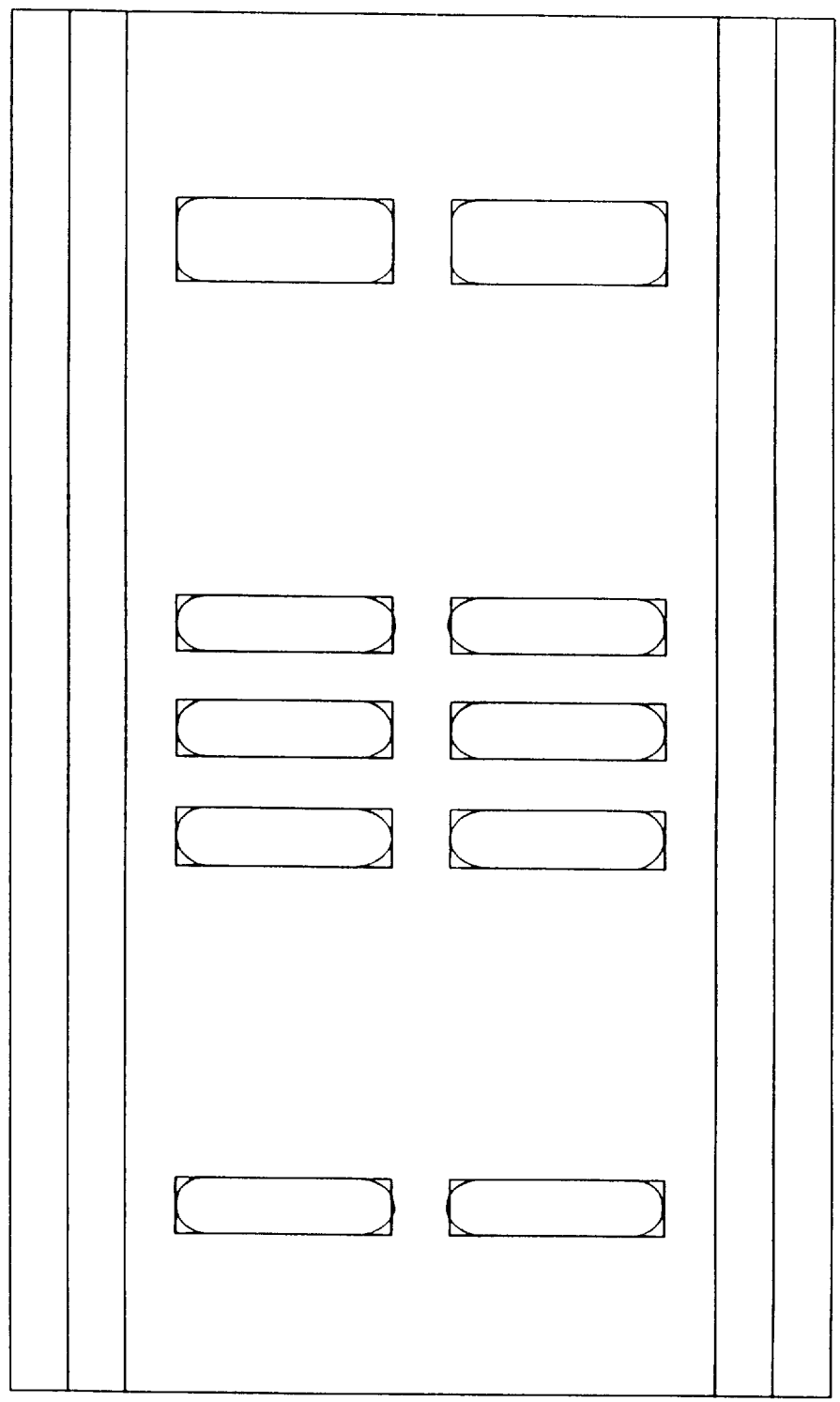
FIG. 23 is a plan view of the transfer image simulated under a focused condition by using the corrected mask pattern shown in FIG. 22.

By this correction, it was possible to successfully reduce the 3σ of the edge deviation at each evaluation point, which was 0.104 μm if the mask was the design pattern as it was, to 0.009 μm. The resist pattern under a focused condition obtained by the mask of FIG. 22 is shown in FIG. 23. It shows that a very good resist pattern is obtained in comparison with FIG. 21 before the correction.

By using the present mask, a semiconductor device having good electrical characteristics can be produced with a high manufacturing yield.

Comparative Example 2

In Comparative Example 2, the processing for correction of the mask pattern was carried out in a similar manner to Example 6 except that evaluation points were arranged at the corners and sides of the design pattern at predetermined intervals (for example 0.175 μm), that is, the evaluation points 30 were added even at portions other than the midpoints of the short sides 32a of the pattern shorter than the predetermined width in Example 6.

Figure 24:
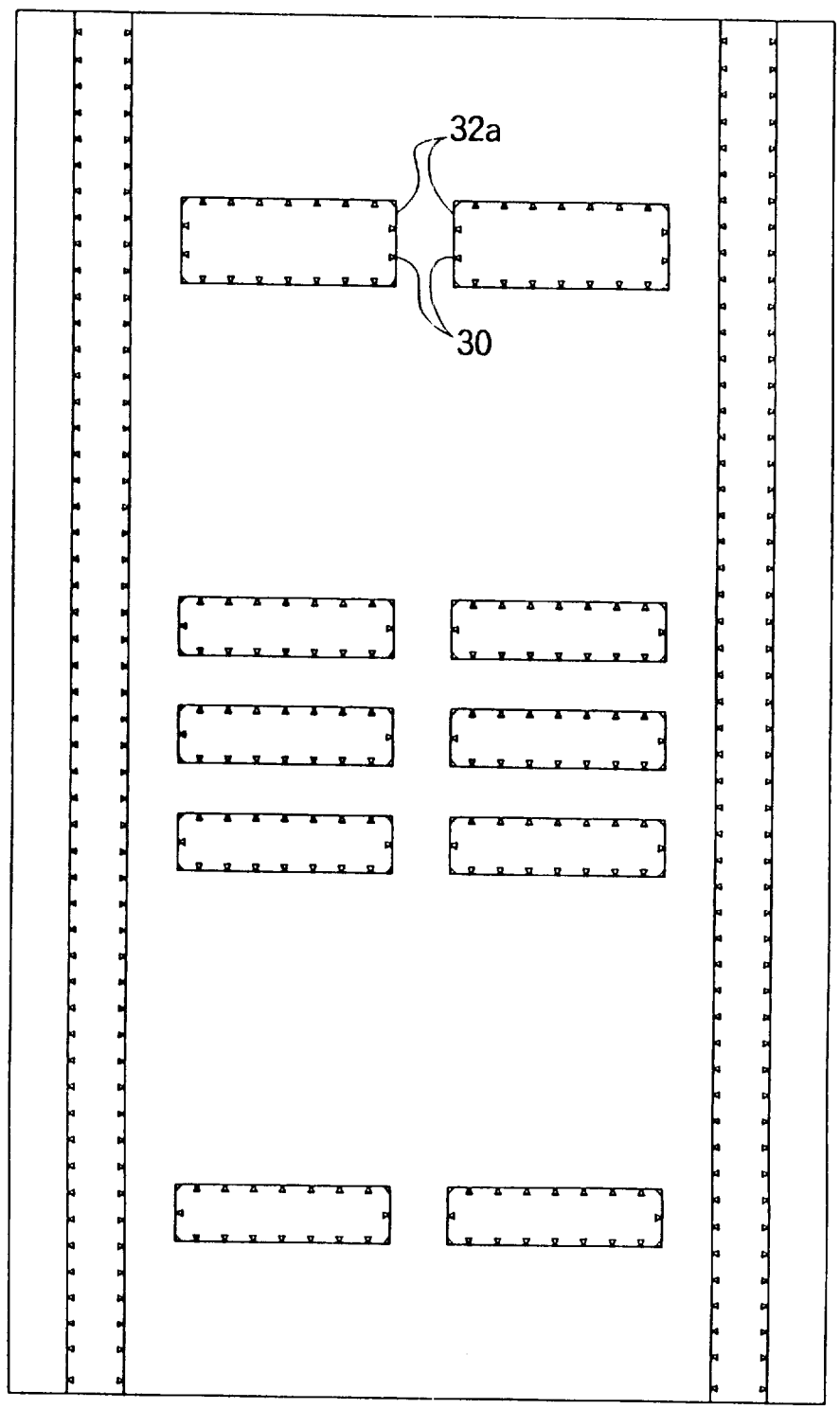
FIG. 24 is a plan view of the method of arranging evaluation points according to Comparative Example 2.
Figure 25:
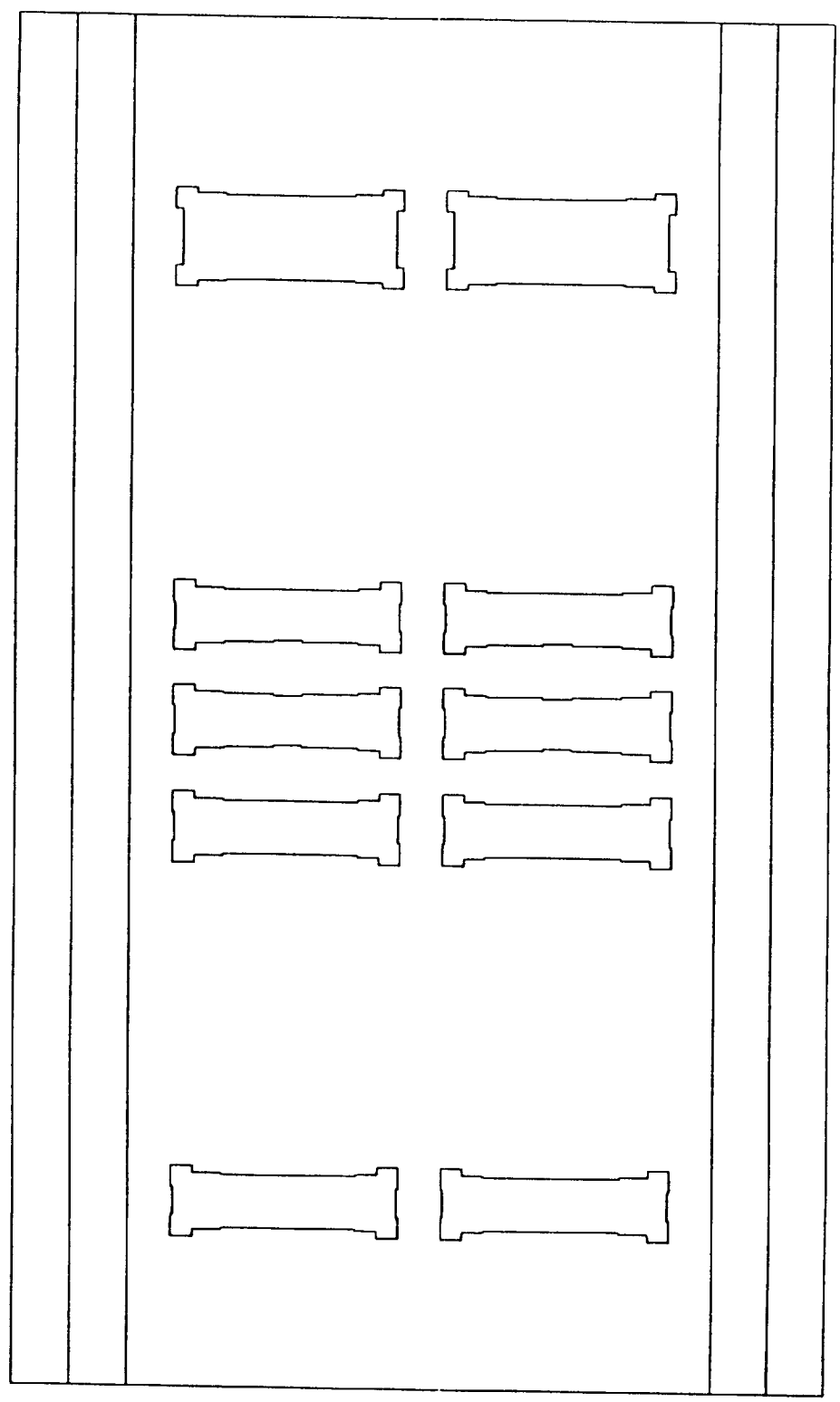
FIG. 25 is a plan view of an example of the corrected mask pattern obtained in Comparative Example 2.
Figure 26:
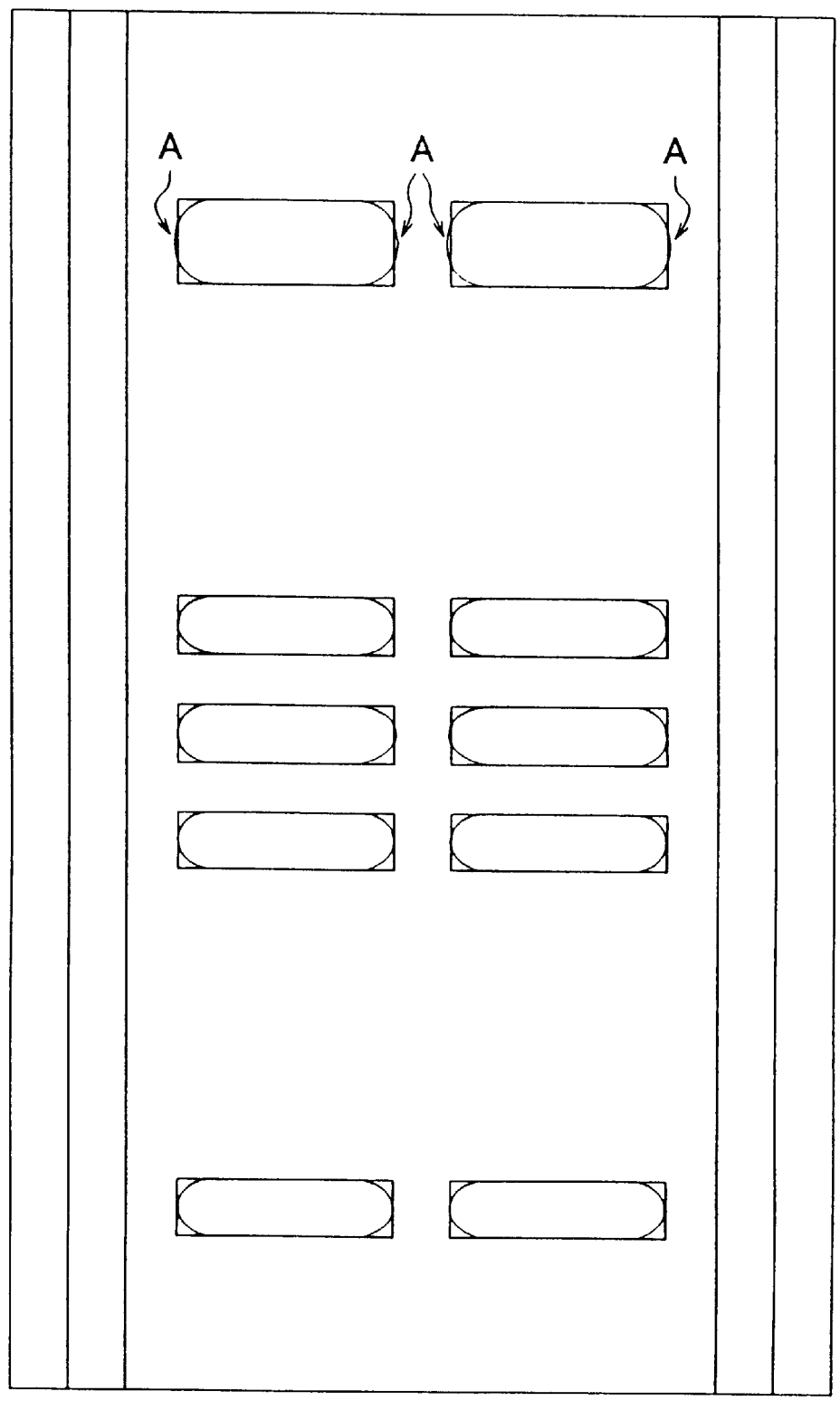
FIG. 26 is a plan view of the transfer image simulated under a focused condition by using the corrected mask pattern shown in FIG. 25.

FIG. 24 shows the evaluation points added to the design pattern; FIG. 25 shows the mask pattern obtained by the correction; and FIG. 26 shows the transfer resist pattern.

Figure 27:
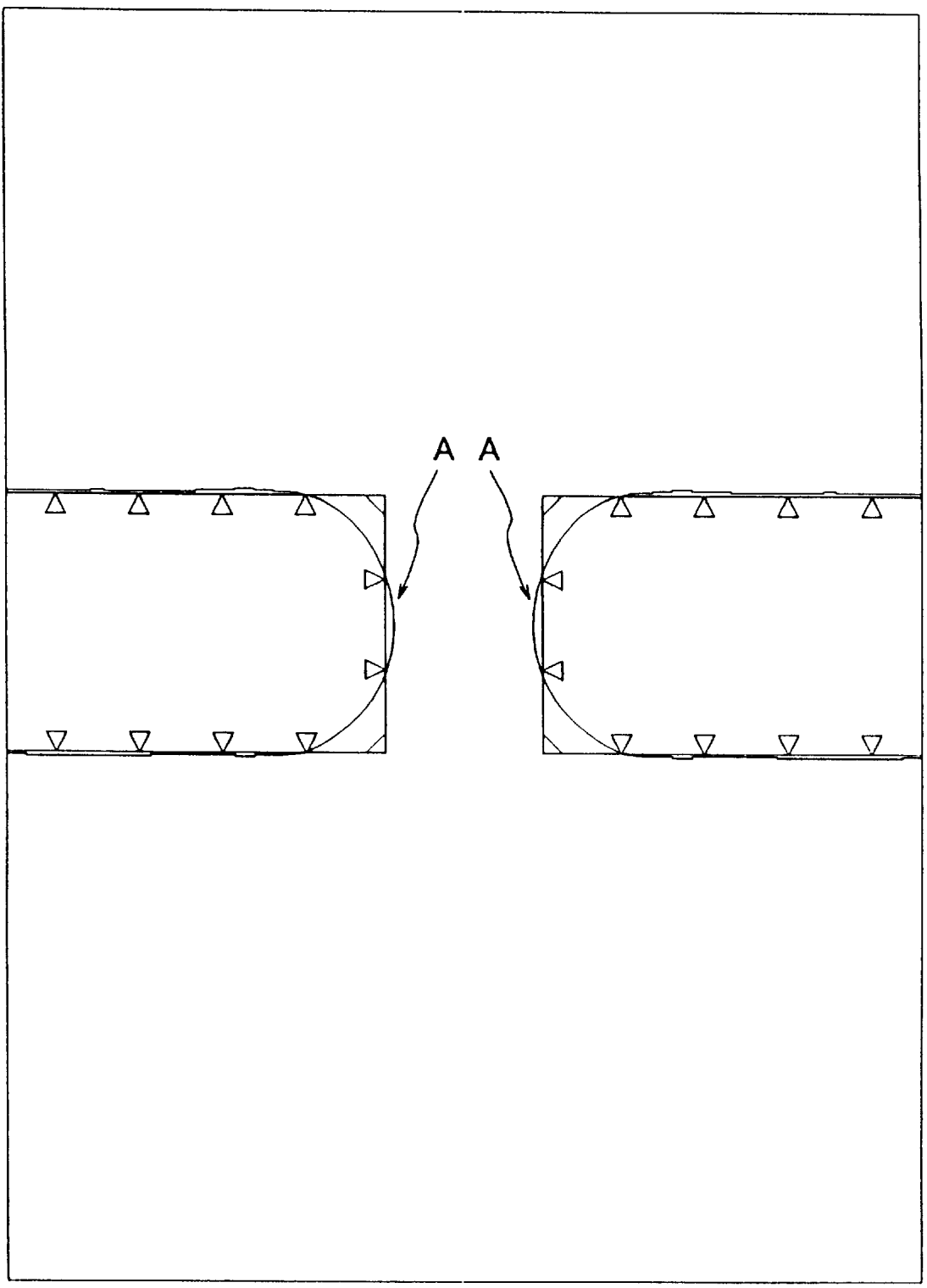
FIG. 27 is an enlarged plan view of principal parts of FIG. 26.
Figure 28:
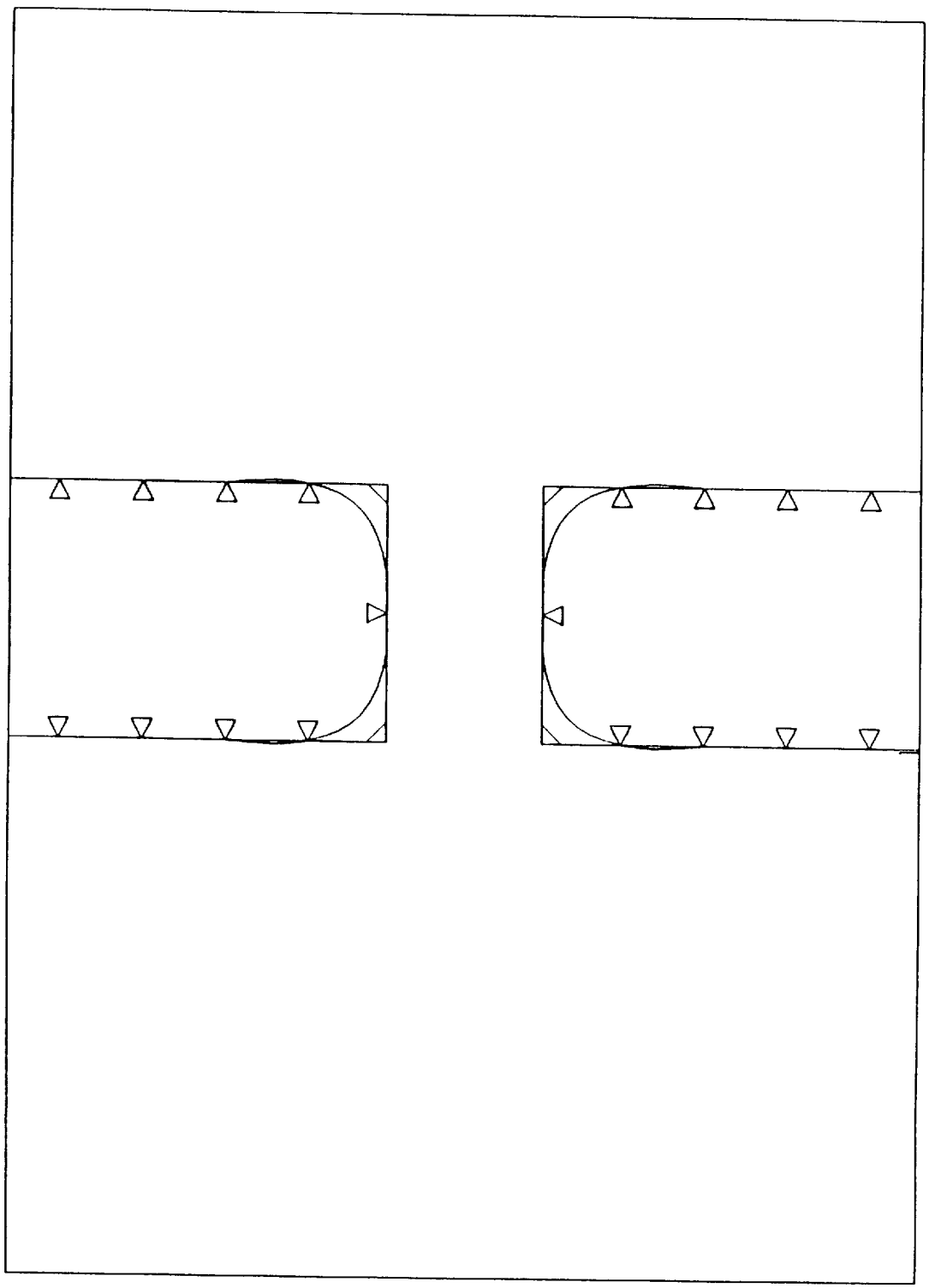
FIG. 28 is an enlarged plan view of principal parts of FIG. 23.

In Comparative Example 2, since the evaluation points are not arranged at the midpoints of the line ends at the points 32a in the figure, while the line widths at the evaluation points are corrected, protrusions of the pattern occur at the midpoint of the line ends (refer to FIG. 27). Contrary to this, in Example 6, since the evaluation points are arranged at the midpoints of the line ends, no protrusions occur (refer to FIG. 28). In this way, by using the method of the present example, the correction precision of the pattern of the line ends can be improved.

EXAMPLE 7

In Example 7, the invention is applied to a case where a pattern of a 0.35 μm rule is exposed under conditions of an exposure wavelength λ of 365 nm, a numerical aperture NA of 0.50, and an apparent size σ of 0.68.

Figure 29:
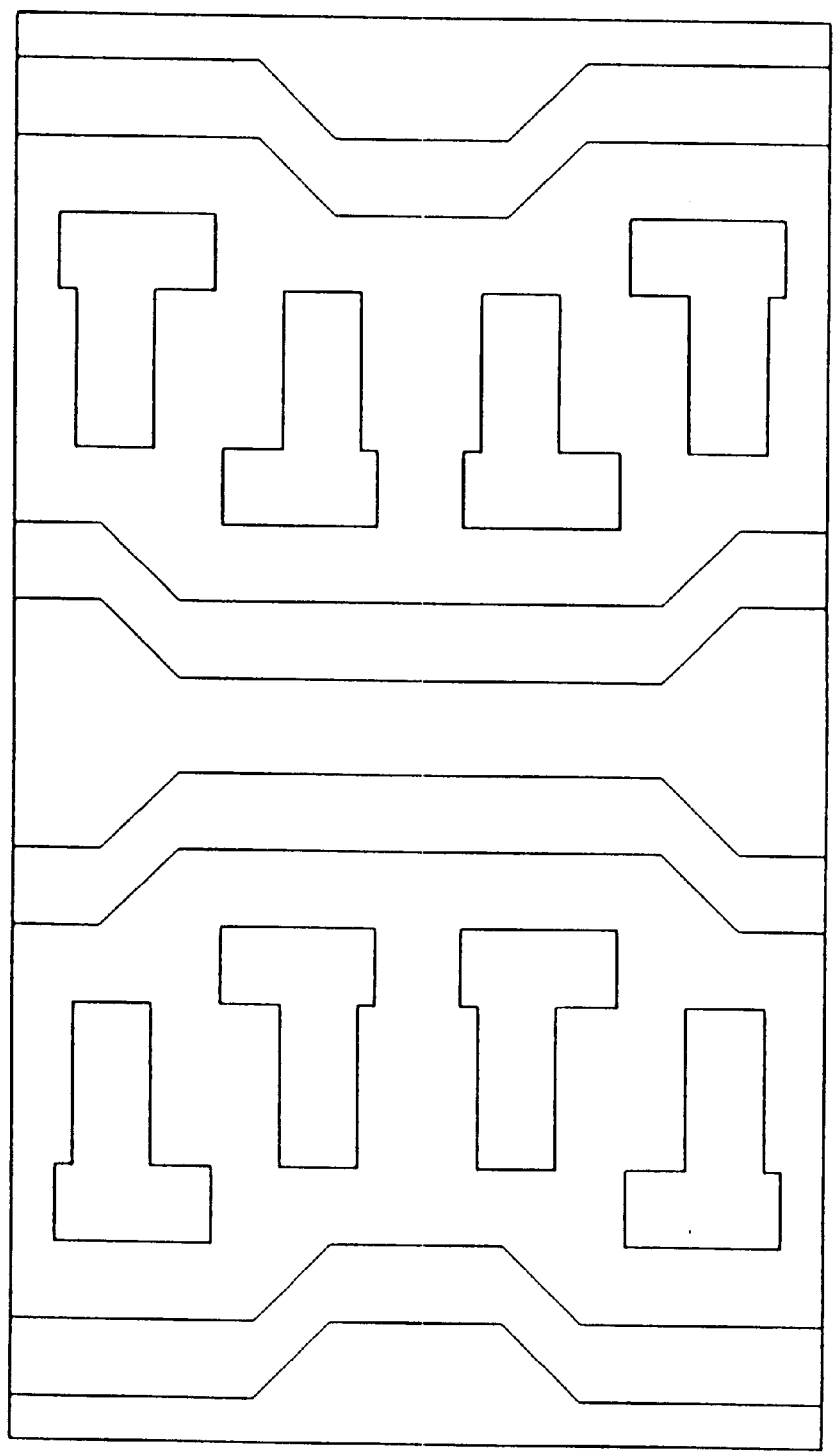
FIG. 29 is a plan view of an initial design pattern of another embodiment of the present invention.

FIG. 29 shows the design pattern used in the present example.

Figure 30:
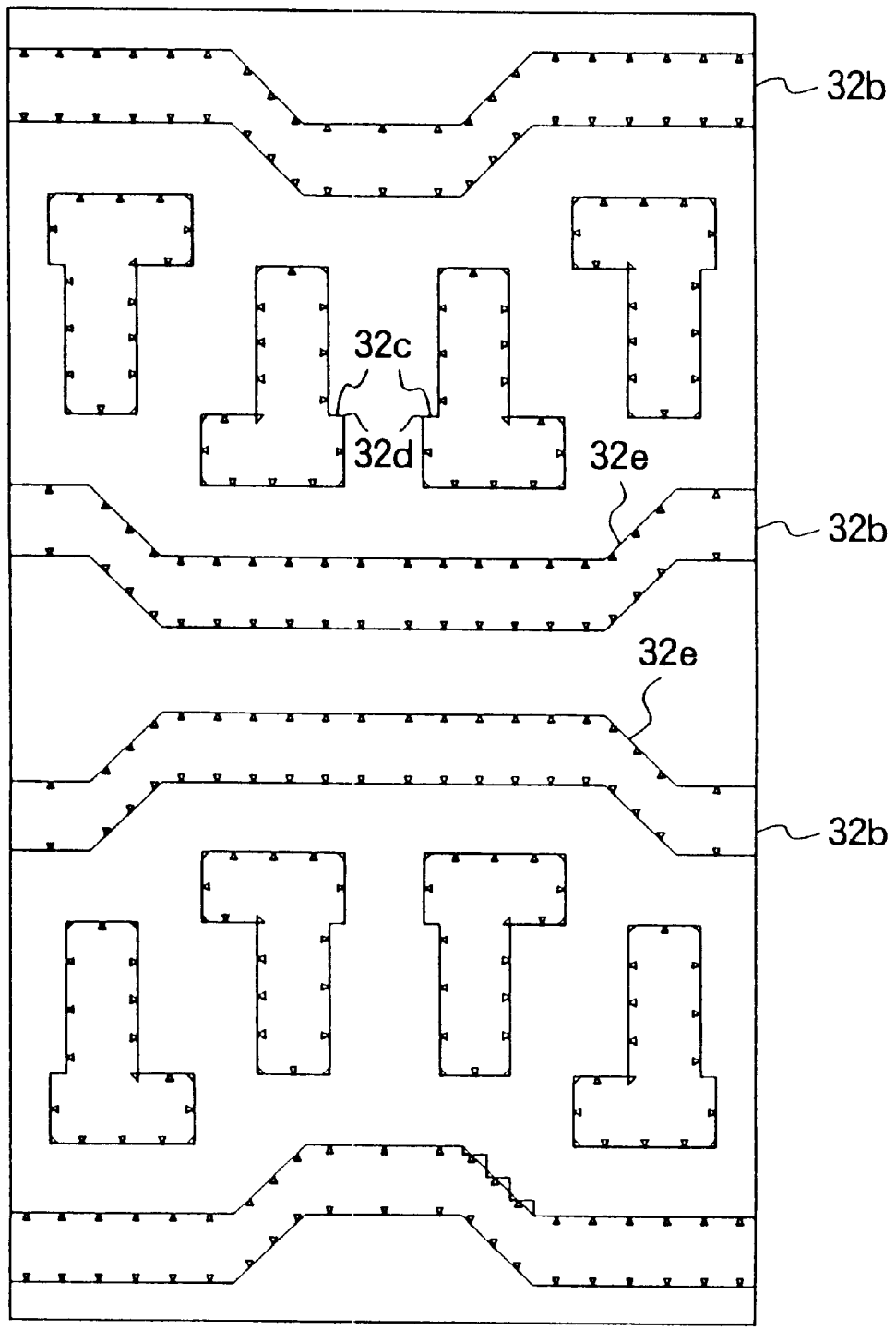
FIG. 30 is a plan view of another example of the method of arranging the evaluation points.

First, as shown in FIG. 30, the evaluation points were generated for the corners and sides of the design pattern. At this time, in the present example, evaluation points were not added to the very small sides 32c of the desired design pattern smaller than a predetermined length and, at the same time, evaluation points were not added to the corners 32d next to the very small sides. Evaluation points were arranged at the other corners and sides at predetermined intervals, respectively. The predetermined length was about 0.3 μm or less in the present example. Further, the slanted side 32e was assumed to be a stepped pattern, and one evaluation point was arranged per horizontal line of each step. Further, the evaluation points were not arranged at the sides at the boundaries 32b of the repeating regions.

Figure 31:
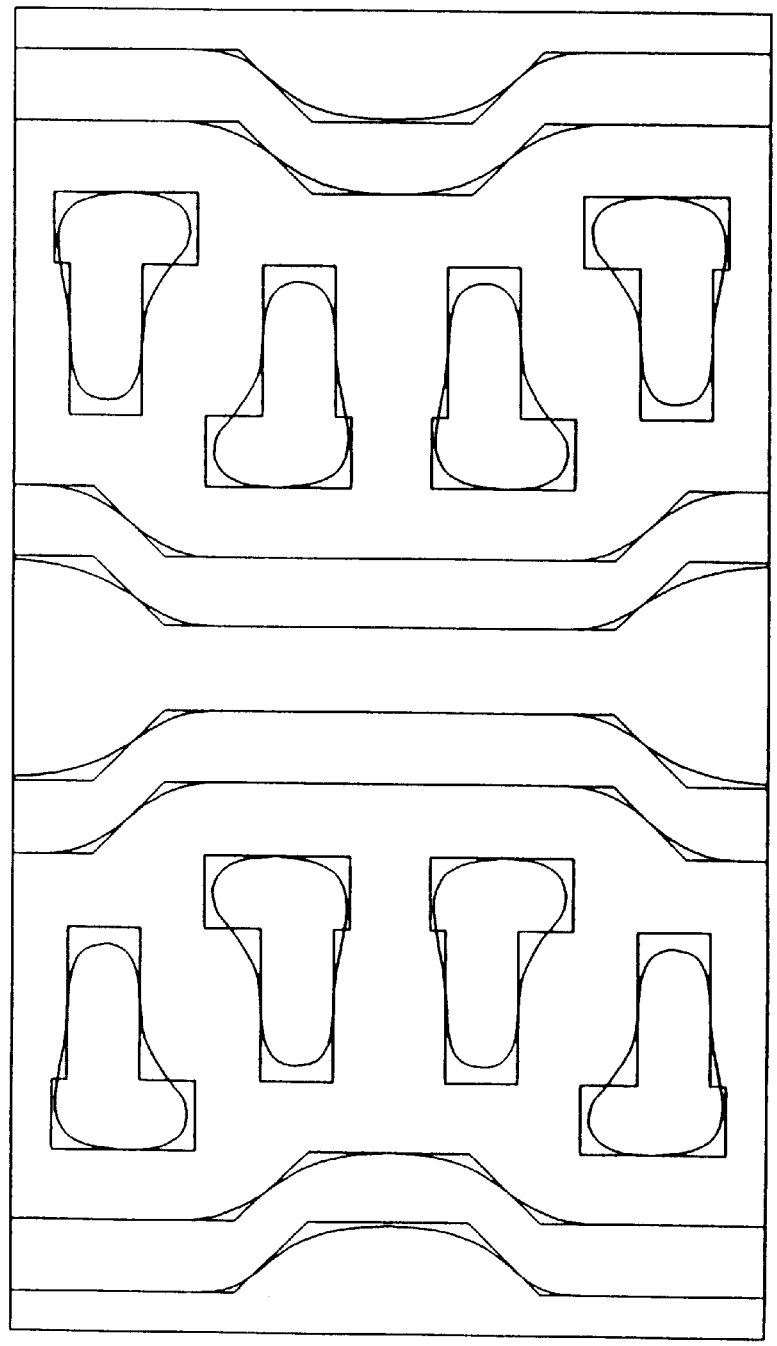
FIG. 31 is a plan view of a pattern showing the result of simulation under a focused condition.

Next, the distribution of light intensity obtained where the mask of this design pattern was transferred as is under a focused condition was found, and the contour lines sliced at the threshold value Eth were found as the resist image (FIG. 31). Note, the threshold value Eth is set so that L in FIG. 31 becomes 0.35 μm.

Subsequently, the amount of deviation of the resist edge position from the evaluation point was found with respect to the edges (corners and sides) of the resist image at all evaluation points. At the evaluation points other than the corners, the direction of measurement of the deviation of the edge position at this time was made the orthogonal direction with respect to the edge and the outward direction of the pattern was made the positive direction. At the corner points, this was made the direction of the sum of the directional vectors of the two sides forming the corner, and similarly the outside of the pattern was made the positive direction.

Note, at the corner evaluation points, in order to prevent excessive correction of the pattern later, the target value of the amount of deviation of the edge was made −0.07 μm for the outwardly projecting corners and was made +0.07 μm for the outwardly recessed corners and the difference of these target values and the amount of deviation of the evaluation point of the edge position was found.

In this way, the side of the mask pattern in the vicinity of each evaluation point was moved in a reverse direction to the obtained amount of deviation of the edge so as to obtain the corrected mask pattern. Here, the amount of movement of the sides of the pattern was made an amount obtained by multiplying the amount of deviation by 0.25.

Further, these procedures were carried out again by maintaining the position of the evaluation point as is and making the corrected mask pattern the pattern input.

Figure 32:
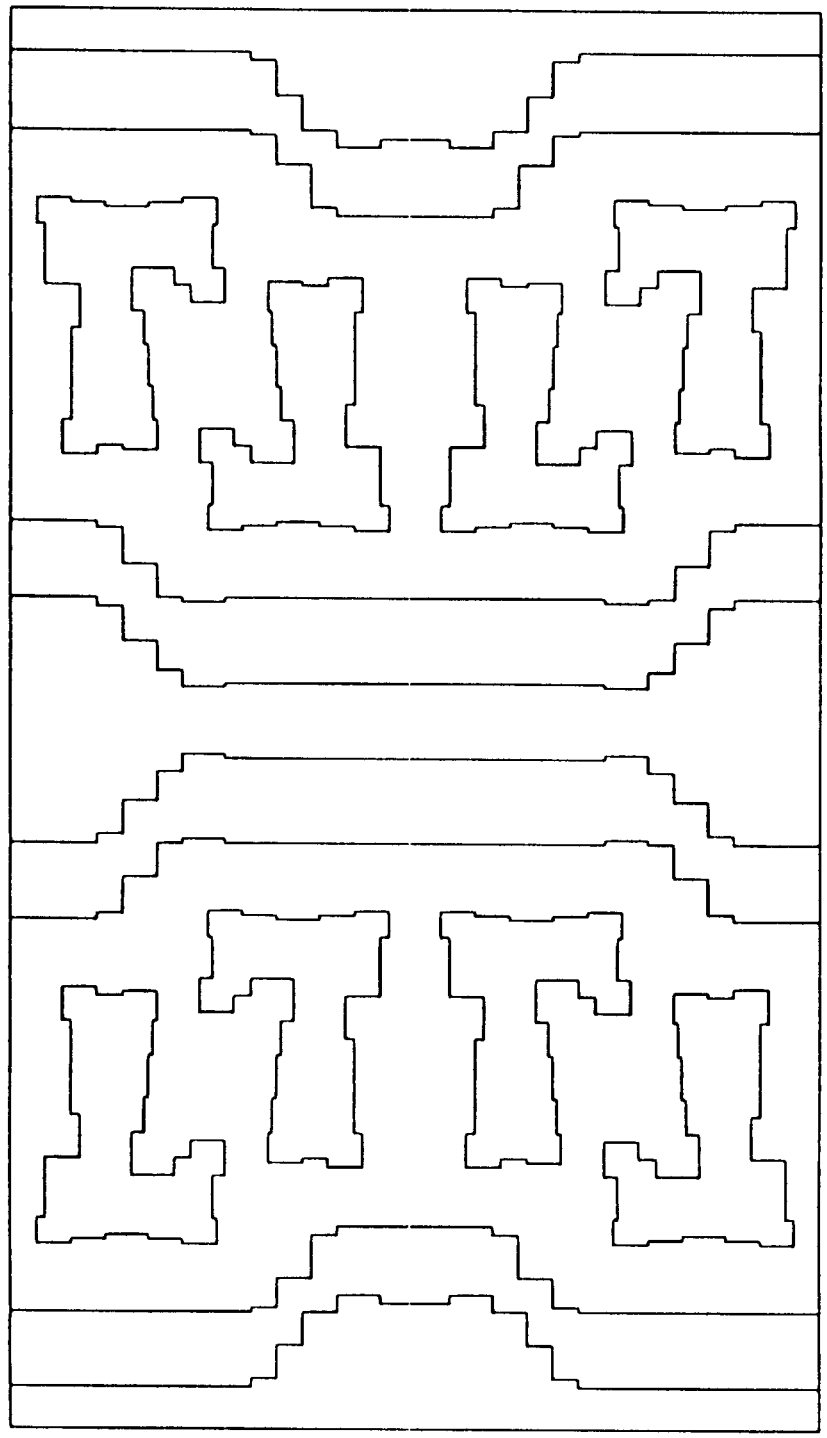
FIG. 32 is a plan view of an example of the mask pattern corrected in a plurality of repeat correcting steps.

By repeating this procedure 8 times, the mask pattern of FIG. 32 was obtained.

Figure 33:
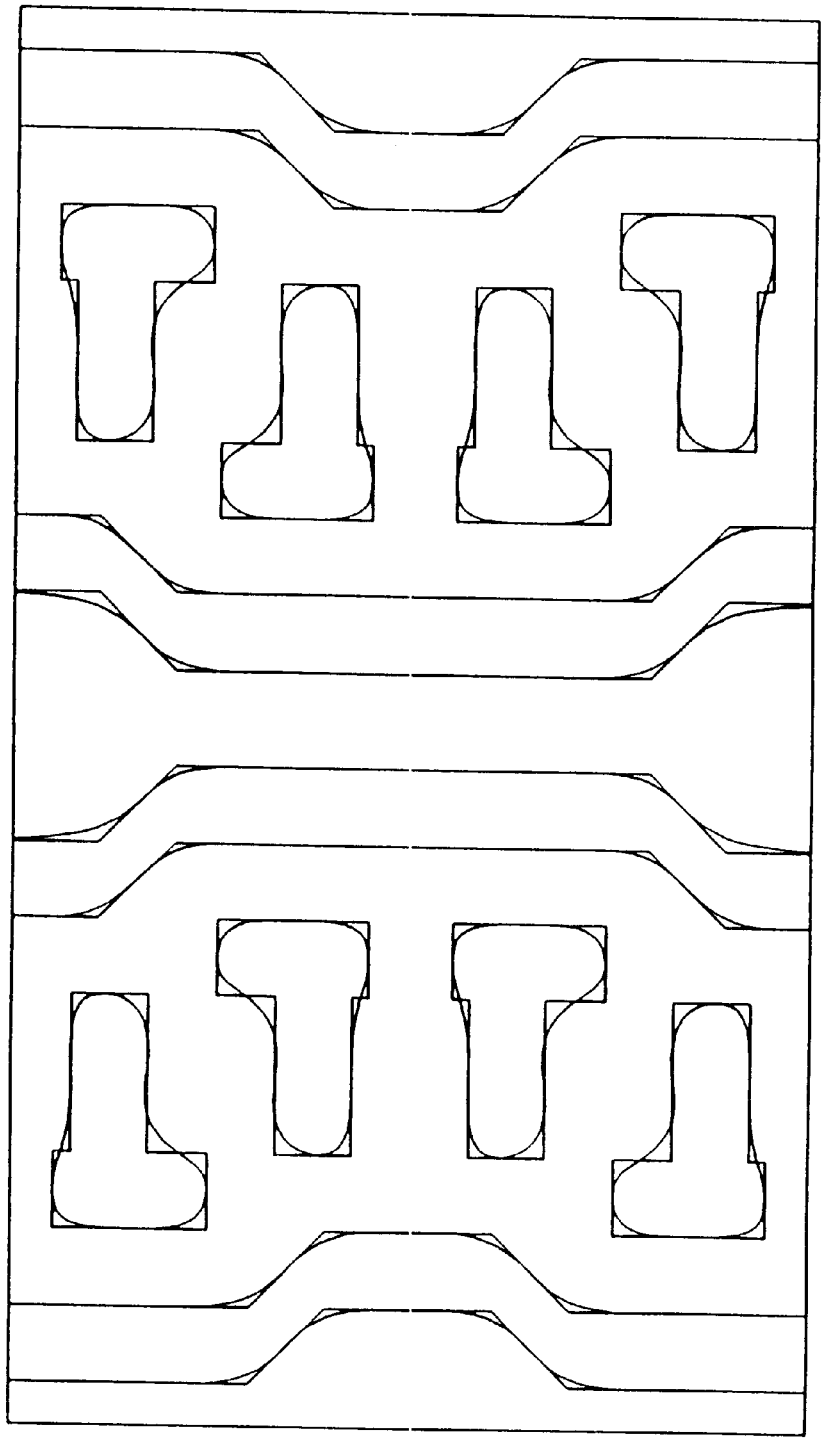
FIG. 33 is a plan view of the transfer image simulated under a focused condition by using the corrected mask pattern shown in FIG. 32.

By this correction, it was possible to successfully reduce the 3σ of the edge deviation at each evaluation point, which was 0.079 μm if the mask was the design pattern as it was, to 0.028 μm. The resist pattern under a focused condition obtained by the mask of FIG. 32 is shown in FIG. 33. It shows that a very good resist pattern is obtained in comparison with FIG. 31 before the correction.

By using the present mask, a semiconductor device having good electrical characteristics can be produced with a high manufacturing yield.

EXAMPLE 8

In Example 8, the invention is applied to a case where a pattern of a polycrystalline silicon layer of a memory device of a 0.35 μm rule is exposed on a positive Novolak resist under conditions of an exposure wavelength λ of 365 nm, a numerical aperture NA of 0.50, and an apparent size σ of 0.68.

Figure 34:
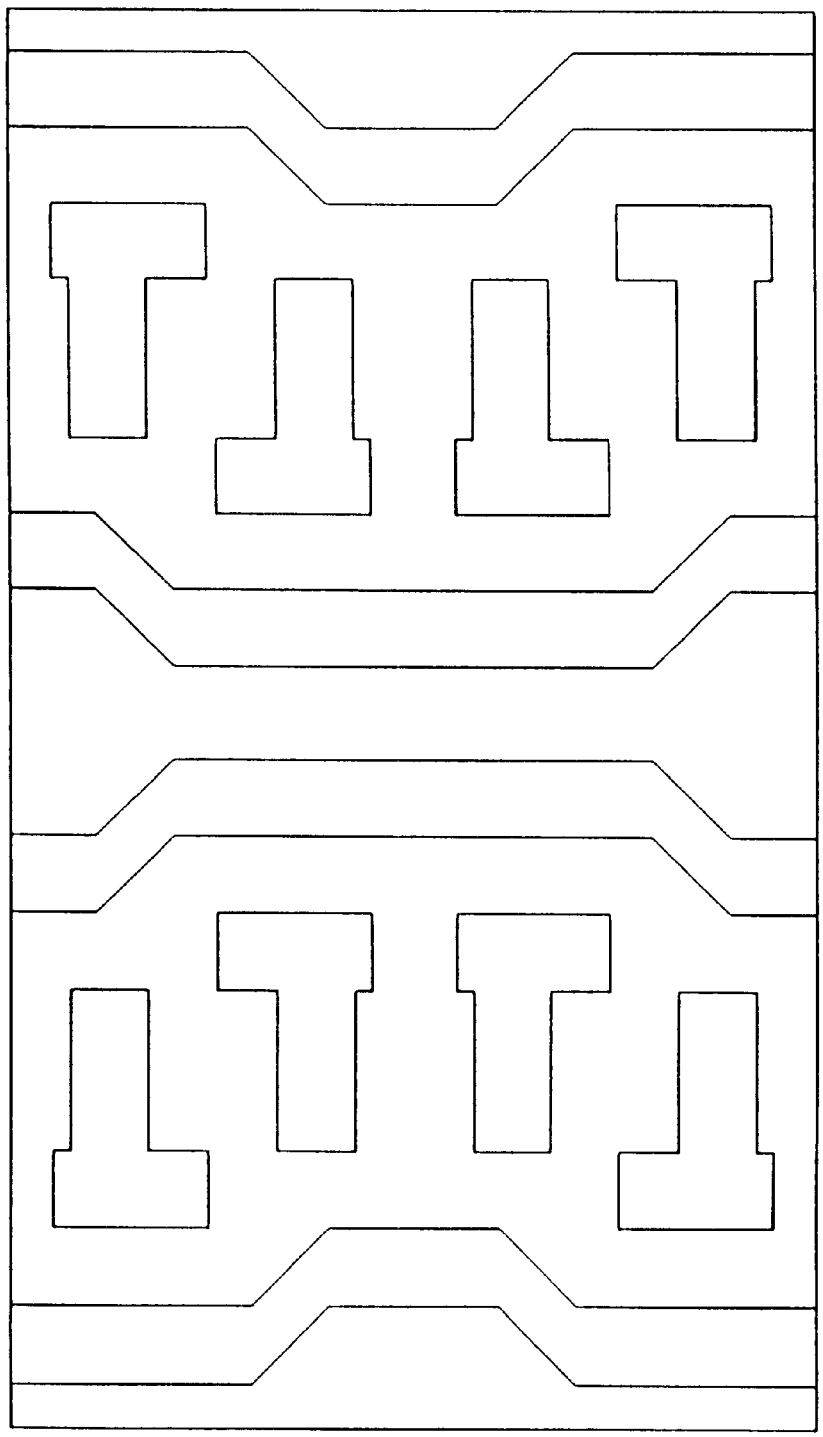
FIG. 34 is a plan view of the initial design pattern according to another embodiment.

FIG. 34 shows the design pattern used in the present example.

First, as shown in FIG. 35, the evaluation points were generated for the sides of the design pattern. At this time, in the present example, the evaluation points were not added to the very small sides 32c of that desired design pattern shorter than a predetermined length and, at the same time, evaluation points were not added to the corners 32d next to the very small sides. Evaluation points were arranged at the other corners and sides at predetermined intervals. The predetermined length was about 0.3 μm or less in the present example. Further, the slanted side 32e was assumed to be a stepped pattern, and one evaluation point was arranged per horizontal line of each step. Further, the evaluation points were not arranged at the sides at the boundaries 32b of the repeating regions.

Figure 36:
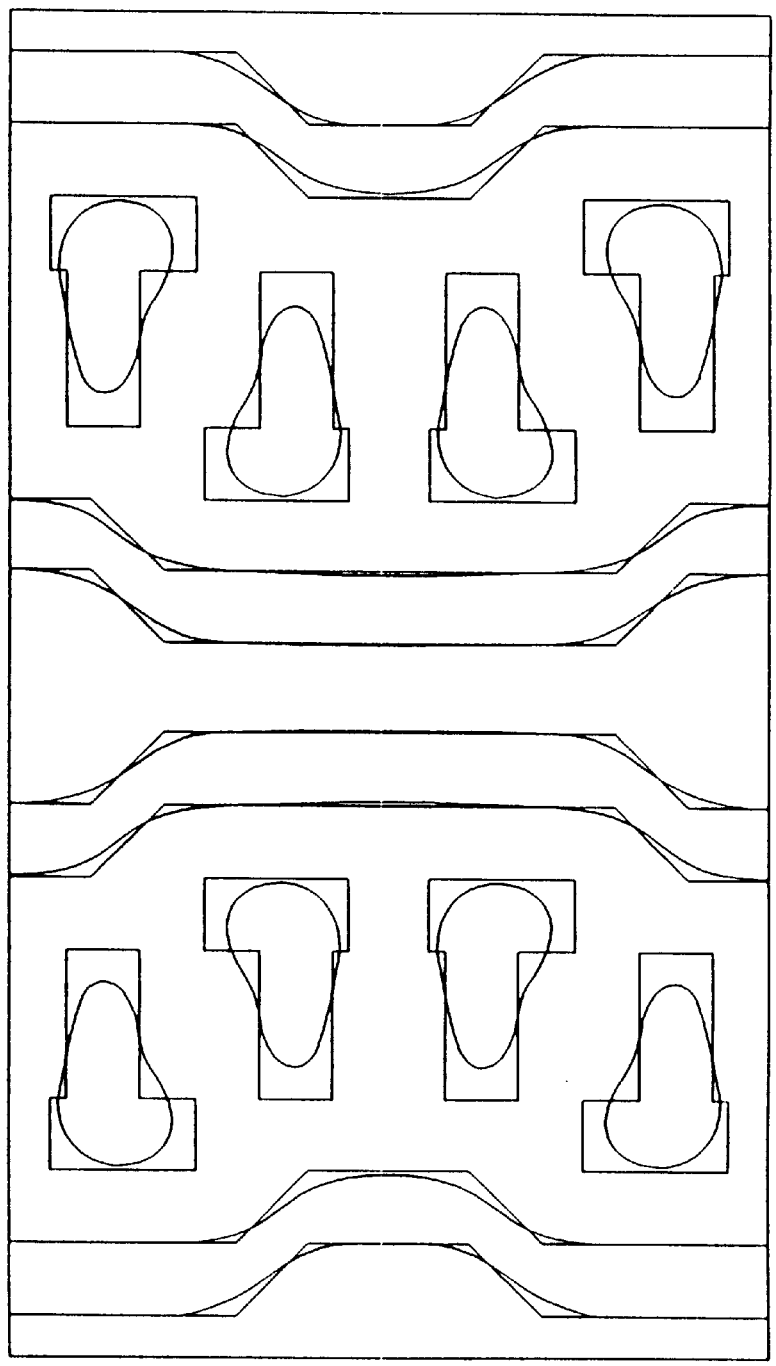
FIG. 36 is a plan view of the result of simulation under a focused condition according to another embodiment.

Next, the distribution of light intensity obtained where the mask of this design pattern was transferred as is under a focused condition was found, this was subjected to the convolution integration as shown by Equation (6), and the contours line obtained by slicing this convolution at the threshold value Eth were found as the resist image (FIG. 36). Note, the threshold value Eth is set so that L in FIG. 36 becomes 0.35 μm.

Figure 37:
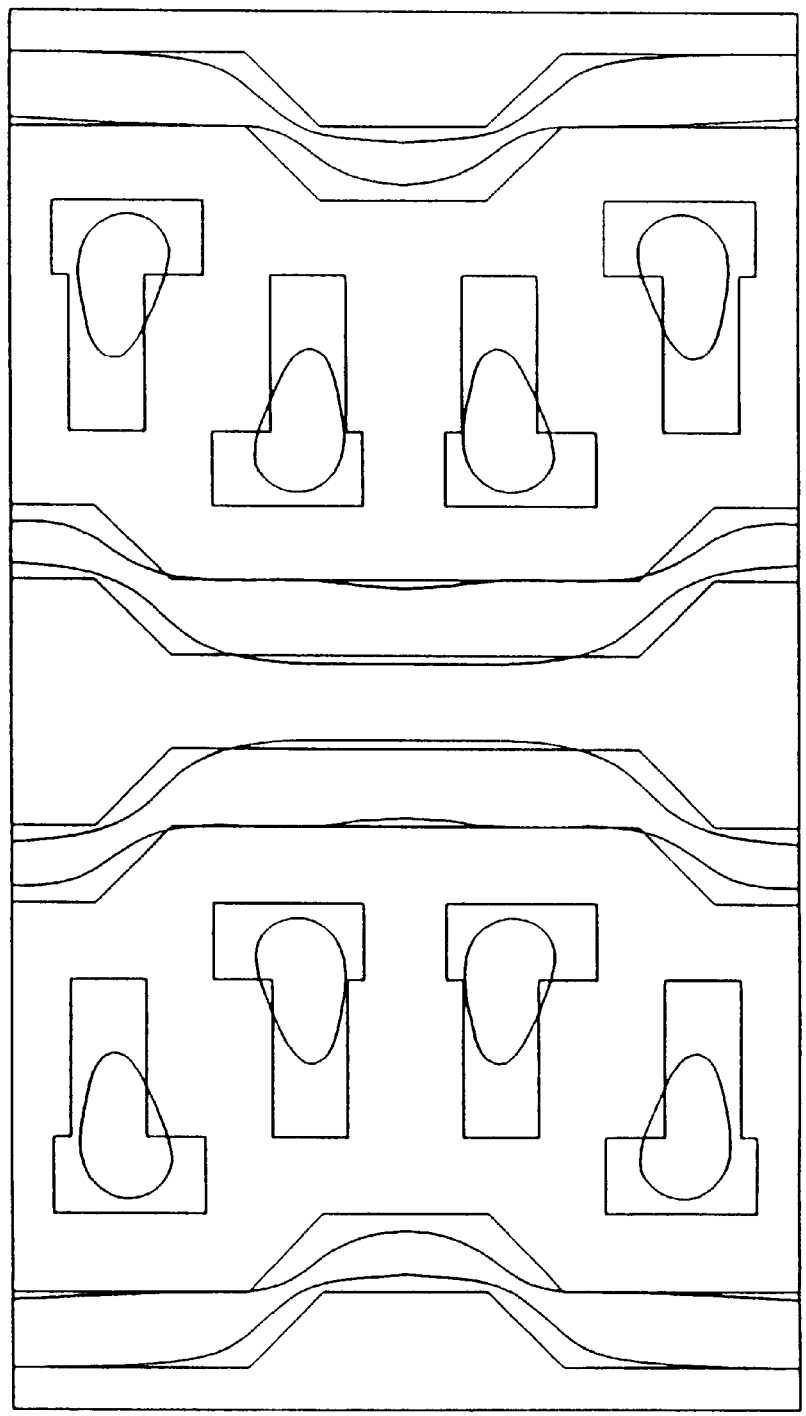
FIG. 37 is a plan view of the pattern showing the result of simulation under defocused conditions according to another embodiment.

Further, the depth of focus necessary in the lithographic process was determined to ±0.75 μm, and the convolution of the light intensity distribution and Gaussian function at a 0.75 μm defocus was found, and the contour lines sliced at the above Eth were found (FIG. 37).

Further, the exposure margin necessary in the lithographic process was made ±10%, the contour lines sliced at the height $Eth^-$ obtained when decreasing Eth by 10% in the two convolutions were found as the resist image where the exposure amount was increased by ±10%, and the contour lines sliced at the height of $Eth^+$ obtained by increasing Eth by 10% were found as the resist image where the exposure amount was reduced by 10%, respectively. By this, a total of six resist images were calculated, i.e., for the focused condition and 0.75 μm defocus in terms of the focal position and for the optimum exposure amount, 10% overdose, and −10% underdose in terms of the exposure amount.

Subsequently, the amounts of deviation of the resist edge positions from the evaluation points were found at all evaluation point for the edges of the six resist images. At the evaluation points other than the corners, the direction of measurement of the deviation of the edge position at this time was made the orthogonal direction with respect to the edge and the outward direction of the pattern was made the positive direction. At the corner points, this was made the direction of the sum of the directional vectors of the two sides forming the corner, and similarly the outside of the pattern was made the positive direction.

The average value of the amounts of deviation of the edges under the six conditions was found for every evaluation point obtained in this way.

Note, at the corner evaluation points, in order to prevent excessive correction of the pattern later, the target value of the amount of deviation of the edge was made −0.07 μm for the outwardly projecting corners and was made +0.07 μm for the outwardly recessed corners and the difference of these target values and the amount of deviation of the evaluation point of the edge position was found. The average value of these was found.

In this way, the side of the mask pattern in the vicinity of each evaluation point was moved in a reverse direction to the obtained amount of deviation of the edge so as to obtain the corrected mask pattern. Here, the amount of movement of the sides of the pattern was made an amount obtained by multiplying the amount of deviation by 0.25.

Further, these procedures were carried out again by maintaining the position of the evaluation point as is and making the corrected mask pattern the pattern input.

Figure 38:
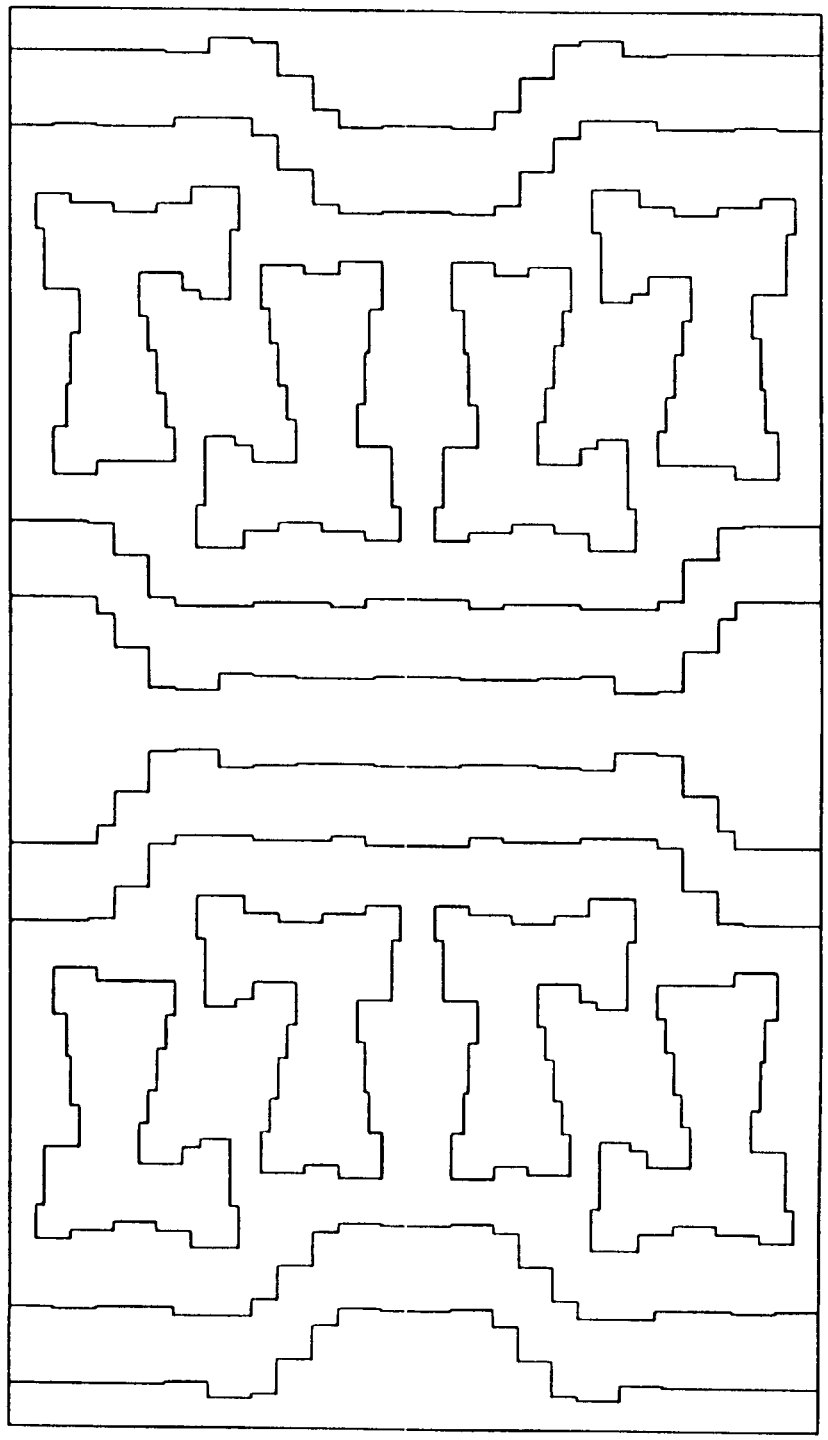
FIG. 38 is a plan view of an example of the mask pattern corrected by a plurality of repeat correcting steps according to another embodiment.

By repeating this procedure four times, the mask pattern of FIG. 38 was obtained.

Figure 39:
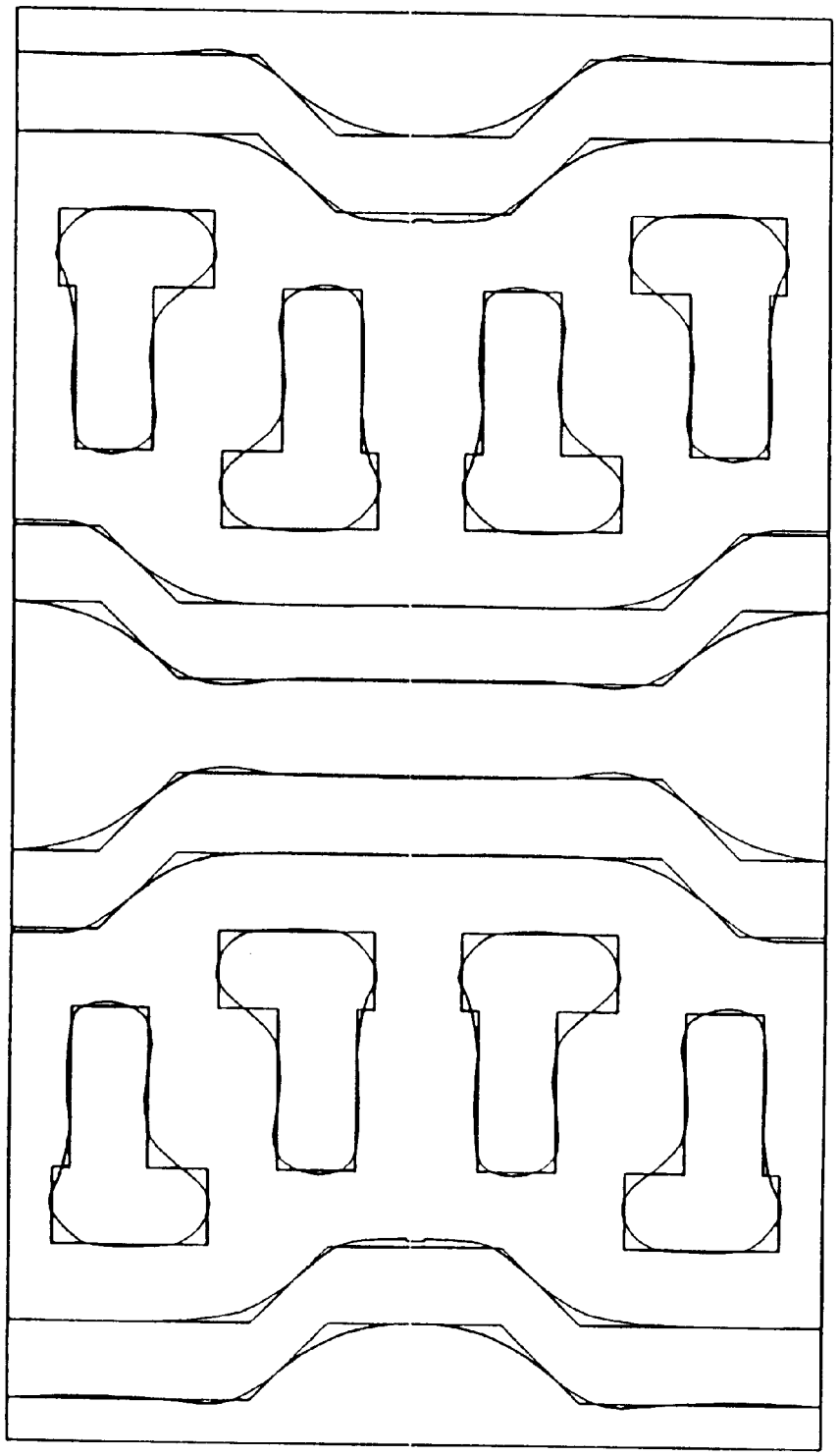
FIG. 39 is a plan view of the transfer image simulated under a focused condition by using the corrected mask pattern shown in FIG. 38.
Figure 40:
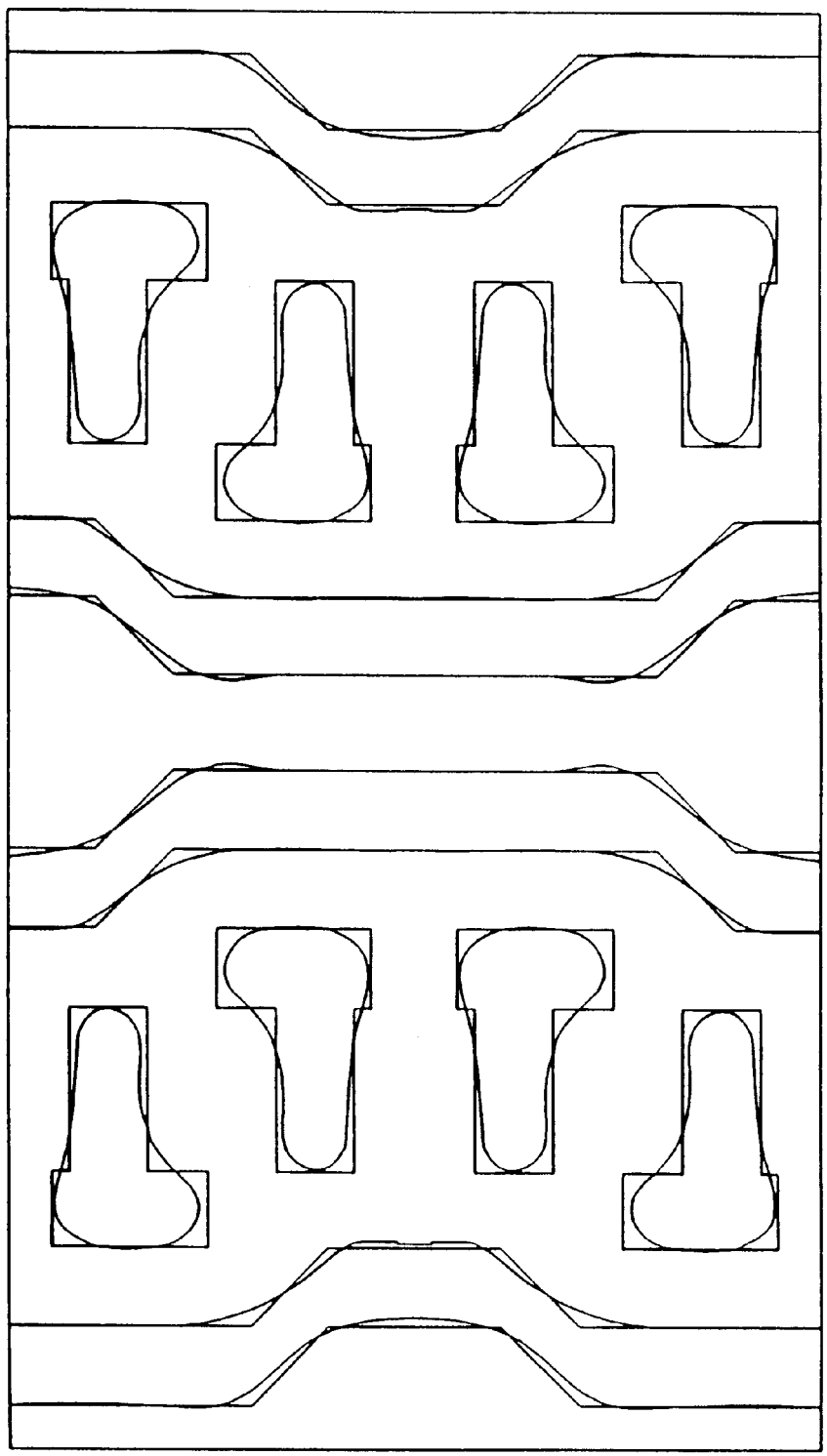
FIG. 40 is a plan view of the transfer image simulated under defocused conditions by using the corrected mask pattern shown in FIG. 38.

By this correction, it was possible to successfully reduce the 3σ of the amounts of edge deviation in the resist patterns of the combinations of the two types of focal positions of the focused condition and 0.75 μm defocus and the three types of exposure amounts of the optimum exposure amount, 10% overdose, and −10% underdose, which was 0.291 μm if the mask was the design pattern as it was, to 0.132 μm in the present example. The resist patterns obtained under a focused condition and 0.75 μm defocus obtained by the mask of FIG. 38 are shown in FIG. 39 and FIG. 40. It is shown that very good resist patterns in comparison with FIGS. 36 and 37 before the correction are obtained.

By using the mask obtained by the method according to the present example, a semiconductor device having good electrical characteristics can be produced with a high manufacturing yield.

Note that, the present invention is not limited to the above examples. The exposure conditions are not limited to the values disclosed in the examples. Also, the photoresist to be used is not limited to the ones in the examples, and the mask pattern is not limited to those of the examples.

Further, as the exposure method, it is also possible to use the modified illumination method and pupil filtering method. Also, the mask to be used can be a phase shift mask such as a halftone system or the Levenson system and is not limited to the present examples.

As explained above, the present invention enables the calculation of a mask pattern that solves the problems of the related art and gives a resist pattern near the design pattern, whereby a means of producing a high performance design with a high manufacturing yield can be provided.

What is claimed is:

1. A semiconductor device produced by photolithography using a photomask having a mask pattern corrected using a method of correction of a mask pattern, wherein the mask pattern of a photomask used in a photolithography process is made to deform so as to give a transfer image equal to a desired design pattern within a predetermined tolerance, said method of correcting a mask pattern comprising the steps of:
arranging a plurality of evaluation points along an outer periphery of said desired design pattern, wherein said arranging further comprises locating evaluation points at corners of said desired design pattern and at predetermined intervals along sides of said desired design pattern;
simulating a transfer image obtained by an exposure under predetermined transfer conditions using a photomask of said desired design pattern;
comparing, for each evaluation point, a difference between a position of said evaluation point and a position of a corresponding point on said simulated transfer image; and
deforming said design pattern in accordance with said comparison of said evaluation and corresponding points so as to decrease said differences in position between said evaluation points and said corresponding points on said simulated transfer image.

2. A semiconductor device as claimed in claim 1, wherein:
said simulating further comprises simulating transfer images under a plurality of transfer conditions based on combinations of a plurality of amounts of exposure of preset exposure margins and a plurality of focal positions within a present range of focal depths to obtain a plurality of transfer images,
said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

3. A semiconductor device as claimed in claim 1, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

4. A semiconductor device as claimed in claim 1, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

5. A semiconductor device as claimed in claim 4, wherein said coefficient is larger than 0 and less than 1.

6. A semiconductor device as claimed in claim 1, wherein said evaluation point arranging further comprises arranging said evaluation points along said sides of said desired design pattern as follows, a predetermined number of evaluation points are spaced at a first predetermined interval along portions of said sides of the design pattern that are adjacent to said corners of said design pattern, and a second predetermined number of evaluation points are spaced at a second predetermined interval, larger than said first interval, along central potions of said sides of said design pattern that are spaced away from the corners.

7. A semiconductor device as claimed in claim 6, wherein:

said simulating further comprises simulating transfer images under a plurality of transfer conditions based on combinations of a plurality of amounts of exposure of preset exposure margins and a plurality of focal positions within a present range of focal depths to obtain a plurality of transfer images, said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

8. A semiconductor device as claimed in claim 6, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

9. A semiconductor device as claimed in claim 6, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

10. A semiconductor device as claimed in claim 9, wherein said coefficient is larger than 0 and less than 1.

11. A semiconductor device as claimed in claim 1, wherein said evaluation point arranging further comprises:

identifying short sides of said design pattern, said short sides having a length less than a predetermined threshold, and avoiding arranging evaluation points along said short sides or at corners of said design pattern adjacent to one of said short sides.

12. A semiconductor device as claimed in claim 11, wherein:

said simulating further comprises simulating transfer images under a plurality of transfer conditions based on combinations of a plurality of amounts of exposure of preset exposure margins and a plurality of focal positions within a present range of focal depths to obtain a plurality of transfer images, said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

13. A semiconductor device as claimed in claim 11, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

14. A semiconductor device as claimed in claim 11, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

15. A semiconductor device as claimed in claim 14, wherein said coefficient is larger than 0 and less than 1.

16. A semiconductor device as claimed in claim 1, wherein said evaluation point arranging further comprises:

identifying repeating regions of said design pattern, and avoiding arranging evaluation points at corners or along the sides of the design pattern which are on a boundary between repeating regions.

17. A semiconductor device as claimed in claim 16, wherein:

said simulating further comprises simulating transfer images under a plurality of transfer conditions based on combinations of a plurality of amounts of exposure of preset exposure margins and a plurality of focal positions within a present range of focal depths to obtain a plurality of transfer images, said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

18. A semiconductor device as claimed in claim 16, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

19. A semiconductor device as claimed in claim 16, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

20. A semiconductor device as claimed in claim 19, wherein said coefficient is larger than 0 and less than 1.

21. A semiconductor device as claimed in claim 1, wherein said evaluation point arranging further comprises:

identifying short sides of said design pattern which have a length less than a predetermined length, identifying a point which is substantially a midpoint of each of said identified short sides, and arranging an evaluation point at each of said midpoints.

22. A semiconductor device as claimed in claim 21, wherein:

said simulating further comprises simulating transfer images under a plurality of transfer conditions based on combinations of a plurality of amounts of exposure of preset exposure margins and a plurality of focal positions within a present range of focal depths to obtain a plurality of transfer images, said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

23. A semiconductor device as claimed in claim 21, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

24. A semiconductor device as claimed in claim 21, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

25. A semiconductor device as claimed in claim 24, wherein said coefficient is larger than 0 and less than 1.

26. A semiconductor device as claimed in claim 1, wherein said evaluation point arranging further comprises:

identifying short sides of said design pattern which have a length shorter than a predetermined length, avoiding arranging evaluation points at corners of said design pattern which are adjacent to one of said short sides, and increasing a spacing between evaluation points along a portion of each of said sides of said design pattern which is adjacent to one of said short sides, said portion being an end portion adjoining one of said short sides.

27. A semiconductor device as claimed in claim 26, wherein:

said simulating further comprises simulating transfer images under a plurality of transfer conditions based on combinations of a plurality of amounts of exposure of preset exposure margins and a plurality of focal positions within a present range of focal depths to obtain a plurality of transfer images, said comparing further comprises comparing, for each evaluation point, the difference between a position of said evaluation point and a position of a point on each of said plurality of transfer patterns to calculate a plurality of differences for each evaluation point, and said deforming further comprises deforming the design pattern so that the plurality of differences for each evaluation point is decreased.

28. A semiconductor device as claimed in claim 26, wherein said simulating further comprises:

calculating a two-dimensional light intensity pattern on a substrate based on said design pattern and transfer conditions, calculating and cumulatively adding effects on an exposure energy at a particular position on the two-dimensional plane of the substrate caused by light intensities at a plurality of secondary positions surrounding said particular position based on distances between said particular position and said surrounding positions so as to calculate a latent image-forming intensity at said particular position, finding a distribution of said latent image-forming intensity at the two-dimensional plane of the substrate, determining a threshold value of the latent image-forming intensity corresponding to the amount of exposure and development conditions, finding the contours of the threshold value for the distribution of latent image forming intensity, and calculating a pattern defined by said contours as the transfer image.

29. A semiconductor device as claimed in claim 26, wherein said deforming further comprises moving boundary lines of the design pattern around each of said evaluation points by an amount equal to said difference in position between that evaluation point and the corresponding point on said simulated transfer image multiplied by a predetermined coefficient in a direction counter to said difference in position.

30. A semiconductor device as claimed in claim 29, wherein said coefficient is larger than 0 and less than 1.

31. A semiconductor device as claimed in claim 1, wherein:

if an evaluation point is along a side of said design pattern, said difference between said evaluation point and said point on said simulated transfer image is measured along a line orthogonal to said design pattern at said evaluation point; and if an evaluation point is at a corner of said design pattern, said difference is measured along a line which is a sum of directional vectors representing sides of said corner.

* * * * *